US006642072B2

(12) United States Patent
Inoue et al.

(10) Patent No.: US 6,642,072 B2
(45) Date of Patent: Nov. 4, 2003

(54) LIGHT-EMITTING ELEMENT, SEMICONDUCTOR LIGHT-EMITTING DEVICE, AND MANUFACTURING METHODS THEREFOR

(75) Inventors: Tomio Inoue, Kagoshima (JP); Kenichi Sanada, Hioki-gun (JP); Kenichi Koya, Kagoshima (JP); Yasuhiko Fukuda, Hioki-gun (JP)

(73) Assignee: Matsushita Electric Industrial Co., Ltd. (JP)

( * ) Notice: Subject to any disclaimer, the term of this patent is extended or adjusted under 35 U.S.C. 154(b) by 117 days.

(21) Appl. No.: 10/014,454

(22) Filed: Dec. 14, 2001

(65) Prior Publication Data
US 2002/0081773 A1 Jun. 27, 2002

Related U.S. Application Data

(62) Division of application No. 09/557,573, filed on Apr. 21, 2000, which is a division of application No. 09/155,420, filed as application No. PCT/JP97/04916 on Dec. 26, 1997, now Pat. No. 6,333,522.

(30) Foreign Application Priority Data

Jan. 31, 1997 (JP) .............................. 9-018782
Feb. 4, 1997 (JP) .............................. 9-021124
Nov. 5, 1997 (JP) .............................. 9-302473

(51) Int. Cl.$^7$ .............................................. H01L 21/00
(52) U.S. Cl. .............................. 438/26; 438/25; 438/29
(58) Field of Search ............................... 438/22, 28, 29, 438/116, 111, 15, 25, 26, 51, 55, 123; 257/21, 53, 79, 82, 88, 916, 33.057

(56) References Cited

U.S. PATENT DOCUMENTS 4,476,620 A * 10/1984 Ohki et al. .................. 438/33
5,027,995 A 7/1991 Karl et al.

(List continued on next page.)

FOREIGN PATENT DOCUMENTS

JP 56-079482 6/1981
JP 58-162085 9/1983

(List continued on next page.)

OTHER PUBLICATIONS

Notice of Reasons of Rejection, Mailed in JP Application No. 10–532702, 8 pages (including Japanese language version), Mailed Oct. 24, 2000, & References cited therein, with Full English translation.
Notice of Reasons of Rejection, Mailing No. 046818, 6 pages (inluses 3 pages of English translation), Mailing Date Feb. 27, 2001, & References cited therein.
European Search Report, Dated: Jul. 6, 2001.
Notice of Reasons for Rejection, Patent Application No. 10–532702 Mailing Date: Sep. 18, 2001.
International Search Report, Dated: Mar. 31, 1998.
Notice of Reasons of Rejection, Dated: Feb. 15, 2001.

*Primary Examiner*—George Fourson
*Assistant Examiner*—Fernando Toledo
(74) *Attorney, Agent, or Firm*—Nixon Peabody LLP; Donald R. Studebaker

(57) ABSTRACT

A GaN-based LED element 1 having a double heterostructure, which includes a GaN layer and the like and is formed on a sapphire substrate, is mounted face-down on a Si diode element 2 formed in a silicon substrate. Electrical connections are provided via Au microbumps 11 and 12 between a p-side electrode 5 of the GaN-based LED element 1 and an n-side electrode 8 of the Si diode element 2 and between an n-side electrode 6 of the GaN-based LED element 1 and a p-side electrode 7 of the Si diode element 2. The Si diode element 2 functions to protect the LED element 1 from an electrostatic destruction. The Si diode element 2 has a backside electrode 9 connected to a leadframe 13a. The p-side electrode 7 of the Si diode element 2 has a bonding pad portion 10 connected to a leadframe 13b via an Au wire 17.

12 Claims, 28 Drawing Sheets

U.S. PATENT DOCUMENTS

| | | | |
|---|---|---|---|
| 5,060,027 A | * 10/1991 | Hart et al. | 257/88 |
| 5,118,584 A | 6/1992 | Evans et al. | |
| 5,187,547 A | 2/1993 | Niina et al. | |
| 5,210,051 A | 5/1993 | Carter, Jr. | |
| 5,237,182 A | * 8/1993 | Kitagawa et al. | 257/15 |
| 5,306,662 A | 4/1994 | Nakamura et al. | |
| 5,369,289 A | 11/1994 | Tamaki | |
| 5,557,115 A | 9/1996 | Shakuda | |
| 5,563,422 A | 10/1996 | Nakamura et al. | |
| 5,565,790 A | 10/1996 | Lee | |
| 5,627,383 A | 5/1997 | Cunningham et al. | |
| 5,658,434 A | 8/1997 | Nakamura et al. | |
| 5,751,013 A | 5/1998 | Kidoguchi et al. | |
| 5,767,581 A | 6/1998 | Nakamura et al. | |
| 5,789,265 A | 8/1998 | Nitta et al. | |
| 5,808,360 A | 9/1998 | Akram | |
| 5,812,571 A | * 9/1998 | Peters | 372/36 |
| 5,877,558 A | 3/1999 | Nakamura et al. | |
| 5,882,949 A | 3/1999 | Okazaki | |
| 5,990,495 A | 11/1999 | Ohba | |

FOREIGN PATENT DOCUMENTS

| | | |
|---|---|---|
| JP | 59-188181 | 10/1984 |
| JP | 61-196561 | 8/1986 |
| JP | 62-045193 | 2/1987 |
| JP | 62-299092 | 12/1987 |
| JP | 64-017745 | 1/1989 |
| JP | 01-223414 | 9/1989 |
| JP | 01-231381 | 9/1989 |
| JP | 02-278893 | 11/1990 |
| JP | 04-010671 | 1/1992 |
| JP | 04-501039 | 2/1992 |
| JP | 04-163972 | 6/1992 |
| JP | 05-029601 | 2/1993 |
| JP | 05-175547 | 7/1993 |
| JP | 05-229174 | 9/1993 |
| JP | 06-079167 | 1/1994 |
| JP | 06-250591 | 9/1994 |
| JP | 06-318731 | 11/1994 |
| JP | 075874 | 1/1995 |
| JP | 07-030153 | 1/1995 |
| JP | 07-066456 | 3/1995 |
| JP | 07-111339 | 4/1995 |
| JP | 07-302930 | 11/1995 |
| JP | 08-064846 | 3/1996 |
| JP | 09-026530 | 1/1997 |
| JP | 10-027924 | 1/1998 |
| JP | 10-032347 | 2/1998 |
| WO | 90-01803 | 2/1990 |

* cited by examiner

LIGHT-EMITTING ELEMENT, SEMICONDUCTOR LIGHT-EMITTING DEVICE, AND MANUFACTURING METHODS THEREFOR

TECHNICAL FIELD

The present invention relates to a light-emitting element comprising a semiconductor multilayer film formed on an insulating substrate, to a semiconductor light-emitting device including such a semiconductor light-emitting element, and to manufacturing methods therefor. In particular, the present invention is properly applicable to a light-emitting element (LED) using a gallium-nitride-based compound semiconductor formed on a sapphire substrate and to a light-emitting device comprising such a light-emitting element.

BACKGROUND ART

As the demand for optical devices, such as liquid-crystal display devices, has grown in recent years, various light-emitting elements have found practical applications. Among them is a gallium-nitride-based compound semiconductor ($In_xAl_yGa_{1-X-Y}N$, $0 \leq X$, $0 \leq Y$, $X+Y \leq 1$), which is not only on the current market as a high-intensity blue and green light-emitting diode (LED) but also receiving attention as a prospective material for composing a blue laser diode, a UV sensor, and a solar cell in the future.

FIG. 4A is a plan view of a conventional GaN LED element which is commercially available. FIG. 4B is a cross-sectional view taken along the line B—B thereof. FIG. 4C is a cross-sectional view taken along the line C—C thereof. It is to be noted that the thickness of each semiconductor layer shown in the drawings does not necessarily coincide with the actual thickness thereof. FIG. 5 is a cross-sectional view of a conventional LED lamp which is commercially available. The GaN LED element 40 has a double heterostructure including a GaN buffer layer 31, an n-type GaN layer 32, an InGaN active layer 33, a p-type AlGaN layer 34, and a p-type GaN layer 35 which are stacked sequentially in layers on the top face of a sapphire substrate 30. The top face of the n-type GaN layer 32 has a stepped configuration consisting of an upper-level portion and a lower-level portion. An n-side electrode 36 made of Ti and Au is formed on the top face of the lower-level portion of the n-type GaN layer 32. The aforesaid InGaN active layers 33, the p-type AlGaN layer 34, and the p-type GaN layer 35 are stacked sequentially in layers on the top face of the upper-level portion of the n-type GaN layer 32. A transparent electrode 37 for current diffusion made of Ni and Au is formed on the top face of the p-type GaN layer 35, followed by a p-side electrode 38 formed thereon. Since the GaN LED element 40 is formed by using the insulating sapphire substrate, each of the two electrodes is formed on the top face of the sapphire substrate. The top face of the GaN LED element 40 serves as a light-emitting face, which is coated with a protective film 39 except for the bonding pad portions 36a and 38a of the n-side and p-side electrodes 36 and 38. The GaN LED element 40 is die-bonded to a die pad on the tip of a leadframe 44a via an insulating adhesive 43. The n-side electrode 36 of the GaN LED element 40 is connected to the leadframe 44a via an Au wire 41, while the p-side electrode 38 thereof is connected to a leadframe 44b via an Au wire 42. The respective tip portions of the leadframes 44a and 44b carrying the GaN LED element 40 are molded with a transparent epoxy resin 45 to constitute the LED lamp.

The foregoing conventional light-emitting element has the following problems.

To achieve wire bonding for providing an electrical connection between the GaN LED element 40 and another element or the like as described above, each of the bonding pad portions 36a and 38a should be configured as a circle having a diameter of 100 μm or more or a square having sides of 100 μm or more. Moreover, since the two electrodes 36 and 38 are formed on the light-emitting side, the light-emitting efficiency is degraded. If the bonding pad portions 36a and 38a are provided with a sufficiently large area and the light-emitting face is provided with a sufficiently large area for emitting a sufficient amount of light, the size reduction of the light-emitting element will be limited and the scaling down of the light-emitting element will be difficult.

It is therefore a primary object of the present invention to provide a semiconductor light-emitting element and a manufacturing method therefor, which enable a reduction in the area required by the electrodes to achieve electrical connection of the light-emitting element, the scaling down of the entire light-emitting element, and improvements in the brightness and light-emitting efficiency of the light-emitting element.

Another object of the present invention is to provide a light-emitting device comprising the aforesaid light-emitting element and a manufacturing method therefor.

DISCLOSURE OF INVENTION

A light-emitting element according to the present invention comprises: a substrate; a first-conductivity-type semiconductor region formed in the semiconductor substrate; a second-conductivity-type semiconductor region formed on a portion of the first-conductivity-type semiconductor region; a first electrode formed on a portion of the first-conductivity-type semiconductor region other than the portion in which the second-conductivity-type semiconductor region is formed; and a second electrode formed on the second-conductivity-type semiconductor region, the light-emitting element further comprising a plurality of microbumps made of a conductive material and formed on the first and second electrodes, wherein the number of the microbumps formed on the first electrode is one and the number of the microbumps formed on the second electrode is one or more.

Preferably, each of the microbumps has a columnar or mushroom-like configuration, a maximum lateral dimension ranging from 5 to 300 μm, and a height ranging from 5 to 50 μm.

Preferably, a metal layer having excellent adhesion to the first-conductivity-type or second-conductivity-type semiconductor region is provided under at least one of the first and second electrodes.

Another light-emitting element according to the present invention comprises: a substrate; a first-conductivity-type semiconductor region formed in the semiconductor substrate; a second-conductivity-type semiconductor region formed on a portion of the first-conductivity-type semiconductor region; a first electrode formed on a portion of the first-conductivity-type semiconductor region other than the portion in which the second-conductivity-type semiconductor region is formed; and a second electrode formed on the second-conductivity-type semiconductor region, the light-emitting element further comprising a plurality of microbumps made of a conductive material and formed on the first and second electrodes, each of the first and second electrodes having not only a region in which the microbump is formed but also a probe region to come into contact with a probe needle.

Preferably, the probe region of the first electrode is formed to extend over a part of a dicing street.

Still another light-emitting element according to the present invention comprises: a substrate; a first conductivity-type semiconductor region formed in the semiconductor substrate; a second-conductivity-type semi-conductor region formed in a portion of the first-conductivity-type semiconductor region; a first electrode formed on a portion of the first-conductivity-type semiconductor region other than the portion in which the second-conductivity-type semiconductor region is formed; and a second electrode formed on the second-conductivity-type semiconductor region, the light-element further comprising a plurality of microbumps made of a conductive material and formed on the first and second electrodes, the second electrode including an opening for radiating light emitted from the light-emitting element to the outside.

Preferably, the opening formed in the second electrode is configured as a circle with a diameter of 20 $\mu$m or less or as a polygon included in a circle with a diameter of 20 $\mu$m or less.

A conductive transparent electrode may be provided in the opening formed in the second electrode to form an ohmic contact with the second-conductivity-type semiconductor region.

Preferably, the substrate is made of a material transparent to light radiated from the light-emitting element.

The substrate may be made of sapphire and a GaN-based compound semiconductor multilayer structure may be formed in the substrate.

The microbumps may be made of a metal material containing at least Au.

A method of manufacturing a light-emitting element according to the present invention comprises: a first step of forming, on a substrate, a semiconductor layer including at least a first-conductivity-type semiconductor region and a second-conductivity-type semiconductor region overlying the first-conductivity-type semiconductor region; a second step of partially removing the second-conductivity-type semiconductor region to expose a portion of the first-conductivity-type semiconductor region; a third step of forming a first electrode made of a first metal film on the portion of the first-conductivity-type semiconductor region; a fourth step of forming a second electrode made of a second metal film on a portion of the second-conductivity-type semiconductor region; a fifth step of forming a mask member having respective openings corresponding to a portion thereof overlying a part of the first electrode and to a portion thereof overlying a part of the second electrode; a sixth step of depositing a third metal film at least in the openings of the mask member; and a seventh step of removing the mask member and leaving the third metal film on the first and second electrodes to form microbumps.

Still another method of manufacturing a light-emitting element comprises: a first step of forming, on a substrate, a semiconductor layer including at least a first-conductivity-type semiconductor region and a second-conductivity-type semiconductor region overlying the first-conductivity-type semiconductor region; a second step of partially removing the second-conductivity-type semiconductor region to expose a portion of the first-conductivity-type semiconductor region; a third step of forming a first metal film on the portion of the first-conductivity-type semiconductor region; a fourth step of forming a second metal film over the entire surface of the substrate; a fifth step of forming a mask member having respective openings corresponding to a portion of the second metal film overlying a part of the first metal film and to a portion of the second metal film overlying a part of the second-conductivity-type semiconductor region; a sixth step of depositing a third metal film at least in the openings of the mask member; and a seventh step of removing the mask member and patterning the second metal film to leave, on the first-conductivity-type semiconductor region, a first electrode made of the first and second metal films and a microbump on the first electrode, while leaving, on the second-conductivity-type semiconductor region, a second electrode made of the second metal film and a microbump on the second electrode.

The sixth step may include depositing the third metal film by a selective plating technique.

A light-emitting device according to the present invention comprises: a light-emitting element including an insulating substrate and a semiconductor film formed on the insulating substrate, a p-type semiconductor region and an n-type semiconductor region being formed in the vicinity of a top face of the semiconductor film, the light-emitting element emitting light in response to a voltage applied between the p-type semiconductor region and the n-type semiconductor region; and an electrostatic protection element having first and second regions electrically connected to the p-type semiconductor region and to the n-type semiconductor region, respectively, the electrostatic protection element allowing current to flow between the first region and the second region when a voltage exceeding a specified value equal to or lower than a destruction voltage is applied between the p-type and n-type semiconductor regions of the light-emitting element.

Preferably, the electrostatic protection element is constituted such that current is more likely to flow in a forward direction from the first region to the second region than in a reverse direction from the second region to the first region and the p-type semiconductor region of the light-emitting element is electrically connected to the second region of the electrostatic protection element and the n-type semiconductor region of the light-emitting element is electrically connected to the first region of the electrostatic protection element.

Preferably, the electrostatic protection element is a diode.

Preferably, a forward operating voltage of the diode is lower than a reverse destruction voltage of the light-emitting element and a reverse breakdown voltage of the diode is higher than an operating voltage of the light-emitting element and lower than a forward destruction voltage of the light-emitting element.

The electrostatic protection element may be a field-effect transistor in which the first region is a drain region and the second region is a source region and a threshold voltage of the field-effect transistor may be equal to or higher than an operating voltage of the light-emitting element and equal to or lower than each of forward and reverse destruction voltages of the light-emitting element.

Preferably, the light-emitting element and the electrostatic protection element are overlapped each other.

Preferably, the electrostatic protection element is a diode in which current flows in a forward direction from the first region to the second region, the electrostatic protection element having first and second electrodes connected to the first and second regions, respectively, on one surface thereof, the light-emitting element has a p-side electrode connected to the p-type semiconductor region and an n-side electrode connected to the n-type semiconductor region on the top face thereof, and microbumps provide electrical connections between the p-side electrode of the light-emitting element and the second electrode of the electrostatic protection element and between the n-side electrode of the light-emitting element and the first electrode of the electrostatic protection element.

The light-emitting element may be mechanically connected onto the electrostatic protection element with an adhesive and at least one of the first and second electrodes of the electrostatic protection element may be divided into a region connected to the p-side or n-side electrode of the light-emitting element via the microbump and a bonding pad region connected to an external member via a wire.

The light-emitting element may be mechanically connected to the electrostatic protection element with an adhesive and the first and second electrodes of the electrostatic protection element as a whole may be made up of a plurality of rectangular portions divided in a direction.

The light-emitting element may be mechanically connected to the electrostatic protection element with an adhesive and a recess or a projecting portion may be formed to surround the region of the first and second electrodes of the electrostatic protection element in which the adhesive is present.

The light-emitting element may be mounted on the electrostatic protection element and either one of the first and second electrodes of the electrostatic protection element may be formed in the same region as a light-emitting region of the light-emitting element when viewed from above, light emitted from a light-emitting region being reflected upward.

The diode may be a lateral diode in which the first and second regions are p-type and n-type semiconductor regions each formed in a portion of a semiconductor region close to one surface thereof.

The electrostatic protection element may be made of a semiconductor thin film formed on the light-emitting element with an interlayer insulating film interposed therebetween.

The electrostatic protection element and the light-emitting element may be formed in the insulating substrate.

The electrostatic protection element may be made of a semiconductor thin film formed on the insulating substrate.

The insulating substrate of the light-emitting element and the electrostatic protection element may be provided on a single common base substrate.

The electrostatic protection element may be made of a semiconductor thin film formed on the base substrate.

The light-emitting element may be for use as a back light of a liquid-crystal device.

Preferably, the light-emitting element and the electrostatic protection element are accommodated in a single common house.

Preferably, a reflector is further provided at least around the light-emitting element to reflect light emitted from light-emitting element.

The reflector may have an upper end higher in level than a light-emitting region in the light-emitting element.

Preferably, the reflector is formed of a metal lead and the electrostatic protection element is mounted on the metal lead.

Another light-emitting device according to the present invention comprises: a GaN-based compound light-emitting element having an insulating substrate and a GaN-based semiconductor layer formed in the insulating substrate; and an electrostatic protection element for protecting the GaN-based compound light-emitting element from static electricity.

Preferably, the electrostatic protection element is made of a diode element having a p-side electrode and an n-side electrode and the p-side electrode of the diode element is electrically connected to an n-side electrode of the GaN-based light-emitting element and the n-side electrode of the diode element is electrically connected to a p-side electrode of the GaN-based light-emitting element.

Preferably, microbumps provide the connection between the p-side electrode of the diode element and the n-side electrode of the GaN-based light-emitting element and the connection between the n-side electrode of the diode element and the p-side electrode of the GaN-based light-emitting element to constitute a composite device of an electronic device and an optical device.

Preferably, the GaN-based light-emitting element and the electrostatic protection element are incorporated in a single common house.

A method of manufacturing a flip-chip semiconductor light-emitting device according to the present invention comprises: a semiconductor light-emitting element having a semiconductor multilayer film formed on a transparent substrate and p-side and n-side electrodes formed on a surface of the semiconductor multilayer film; a submount element having at least two independent electrodes; and a base capable of supporting the submount element and supplying electric power to the submount element, the submount element being mounted on the base to be electrically conductive to the base, the semiconductor light-emitting element being mounted in a face-down configuration on a top face of the submount element, the manufacturing method comprising: a microbump forming step of forming microbumps on the electrodes of either one of the semiconductor light-emitting element and the submount element; and a chip bonding step of bonding the p-side and n-side electrodes of the semiconductor light-emitting element to the electrodes of the submount element via the microbumps.

The chip bonding step may include the steps of: bringing the semiconductor light-emitting element in the form of a chip closer to a wafer, in which a plurality of submount elements, including the submount element arranged in rows and columns, are formed; and bonding the p-side and n-side electrodes of the semiconductor light-emitting element to the respective electrodes of the submount element formed in the wafer via the microbumps, after the chip bonding, the manufacturing method further comprising the step of separating the wafer into individual chips and forming, from the wafer, plural pairs of the semiconductor light-emitting elements and the submount elements integrated with each other.

The chip bonding step may include the step of applying heat, ultrasonic waves, or load to at least one of the semiconductor light-emitting element and the submount element, while bringing the electrodes opposed to each other into contact with each other via the microbumps, and thereby welding the microbumps to the electrodes.

The microbump forming step may include the step of forming stud bumps onto the p-side and n-side electrodes of the semiconductor light-emitting element and the chip bonding step may include the steps of: aligning the corresponding semiconductor light-emitting element with respect to each of the submount elements in the wafer; and welding the microbumps to the electrodes of each of the submount elements in the wafer to fix the semiconductor light-emitting element onto the submount element and provide mutual electric connections between the opposed electrodes via the microbumps, the manufacturing method further comprising the step of separating, from the wafer, the pairs of the semiconductor light-emitting elements and the submount elements integrated with each other, placing each of the pairs on a mount portion of the base, and fixing the submount element onto the base.

The microbump forming step may include the step of forming stud bumps on the p-side and n-side electrodes of the semiconductor light-emitting element and the chip bonding step may include the step of disposing the submount element on a mount portion of the base, fixing the submount element onto the base, and welding the microbumps to the electrodes of the submount element to fix the semiconductor light-emitting element onto the submount element and provide mutual electric connections between the opposed electrodes via the microbumps.

The microbumps may be formed by a plating process.

The microbump forming step may include the step of forming stud bumps onto the electrodes of each of the submount elements formed in the wafer and the chip bonding step may include the step of aligning the corresponding semiconductor light-emitting element with respect to each of the submount elements in the wafer and welding the microbumps to the electrodes of the semiconductor light-emitting element to fix the semiconductor light-emitting element onto the submount element and provide mutual electric connections between the opposed electrodes via the microbumps.

The microbump forming step may include the step of forming stud bumps on the electrodes of the submount element and the chip bonding step may include disposing the submount element on a mount portion of the base, fixing the submount element onto the base, and welding the microbumps to the electrodes of the semiconductor light-emitting element to fix the semiconductor light-emitting element onto the submount element and provide mutual electric connections between the opposed electrodes via the microbumps.

The microbumps may be formed by a plating process.

After the chip bonding, there may further be performed an optical-characteristic testing step of bringing a probe needle into contact with the submount element and thereby testing light radiated from the semiconductor light-emitting element from above a top face of the transparent substrate by using a detector for an optical characteristic test positioned above the semiconductor light-emitting element.

The chip bonding step may include the steps of: bringing the semiconductor light-emitting element in the form of a chip closer to the wafer, in which the plurality of submount elements, including the submount element arranged in rows and columns, are formed; and bonding the p-side and n-side electrodes of the semiconductor light-emitting element to the respective electrodes of the submount element formed in the wafer via the microbumps.

Preferably, the optical-characteristic testing step is performed with respect to each of the semiconductor light-emitting elements in the wafer after the chip bonding.

BEST MODE FOR CARRYING OUT THE INVENTION

Light-emitting Element

Figure 1:
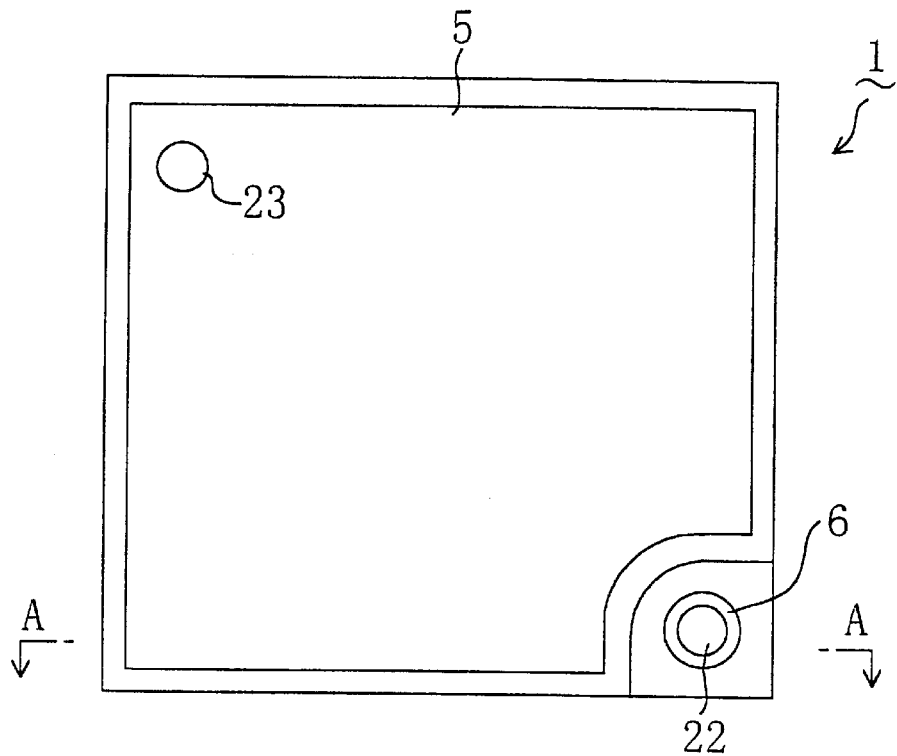
FIG. 1 is a plan view showing the placement of electrodes in a gallium-nitride-based compound semiconductor light-emitting element according to a first embodiment of the present invention.

A light-emitting element according to the present invention comprises one microbump formed on a first electrode and at least another microbump formed on a second electrode. The reason for only one microbump on the first electrode is to minimize the area occupied by the first electrode and maximize the light-emitting area of the light-emitting element. Preferably, a columnar or mushroom-shaped microbump having a diameter on the order of 30 to 40 µm (hereinafter referred to as "dotted microbump") is formed on the first electrode.

In accordance with the present invention, the number of the microbumps on the second electrode is one or more. This is for stably supporting the chip of the semiconductor light-emitting element such as the GaN LED element by means of the dotted microbump provided on the first electrode and the microbump or microbumps provided on the second electrode and thereby preventing the chip from tilting. To achieve the purpose, in the case of forming dotted microbumps on the second electrode, the number of the dotted microbumps is preferably two or more. In the case of forming a series of dotted microbumps into a linear configuration (the resulting microbump is hereinafter referred to as a "linear microbump") or forming a series of dotted microbumps into a planar configuration (the resulting microbump is hereinafter referred to as a "planar microbump"), only one "linear" or "planar" microbump is sufficient.

The maximum lateral dimension of a microbump is preferably in the range of 5 to 300 µm and the height thereof is preferably in the range to 5 to 50 µm. The maximum lateral dimension is preferably 5 µm or more for the ease of formation in forming the microbump by plating. The maximum lateral dimension of a microbump is preferably 300 µm or less.

Preferably, the dotted microbump is configured as a circle having a diameter of 30 to 40 µm or a polygon included in the circle. Preferably, the linear microbump has a width of 20 to 30 µm and a length of 150 to 200 µm.

The height of a microbump is preferably 5 µm or more because the chip of the semiconductor light-emitting element is bonded to a leadframe or the like via microbumps in accordance with a method in which the microbumps are welded with the application of load, heat, and ultrasonic waves. If the height of a microbump is under 5 µm, there is the possibility that the chip is brought into contact with the leadframe at a portion other than the bumps, which may cause a short-circuit failure. On the other hand, the height of a microbump is preferably 50 µm or less because the microbump having a height of this order can be formed easily by using a plating method. More preferably, the height of a microbump is 20 to 30 µm.

In dividing a wafer, in which semiconductor light-emitting elements are formed, into individual chips and mounting the chips on leadframes or the like in an assembly process, if dotted microbumps are provided, each of the chips placed with the microbumps facing downward is supported at least three points by one microbump formed on the first electrode and by two microbumps formed on the second electrode, so that the chip is prevented from tilting. In this case, the three microbumps are preferably positioned to form the three vertices of the largest isosceles triangle that can be included in the chip.

In the case of forming one dotted microbump on the first electrode and one microbump on the second electrode, if the microbump on the second electrode is formed into the linear or planar microbump, the chip is supported at three or more points and prevented from tilting. This eliminates a chip recognition error and an arm pick-up error during the die-bonding process step.

In contrast to the microbump or microbumps provided on the second electrode which can be formed into plural dotted microbumps, a linear microbump, or a planar microbump in various configurations, the microbump provided on the first electrode is preferably formed into a single dotted microbump. This aims at minimizing the area occupied by the first electrode and maximizing the light-emitting area.

In the light-emitting element according to the present invention, even when the chip is bonded to the leadframe or the like via Au microbumps which are welded with the application of load, heat, and ultrasonic waves, the chip is never brought into contact with the leadframe at a portion other than the bumps, so that a short-circuit failure does not occur.

Preferably, metal having excellent adhesion to a first-conductivity-type semiconductor region and/or a second-conductivity-type semiconductor region is placed under the first electrode and/or the second electrode, on which the microbumps are formed. This prevents the problem of peeling off of the electrode due to an ultrasonic wave used along with load and heat in the process step of welding and bonding Au microbumps to bond the chip of the semiconductor light-emitting element to the leadframe via the microbumps. In the case where the first-conductivity-type semiconductor region is of n-type GaN and the second-conductivity-type semiconductor region is of p-type GaN, Ti is the metal having excellent adhesion. The use of Ti is also advantageous in that Ti forms an excellent n-type GaN ohmic contact electrode.

On the top faces of the first and second electrodes, not only the regions where the microbumps are formed, but also respective regions (probe regions) to come into contact with a probe needle may be formed. This prevents the probe needle from touching and destroying the microbumps in the process step of a probe test. Each of the probe regions should have an area of at least 50×50 μm. On the top face of the second electrode, the probe region can be formed easily. In the case of the first electrode, however, the area of the probe region is preferably minimized.

The probe region of the first electrode may be formed to extend over a part of a dicing street. This allows the first electrode to be formed sufficiently large to carry a columnar or mushroom-shaped microbump having a diameter on the order of 30 to 40 μm and maximizes a light-emitting area. In this case, the dicing street is formed to expose the n-type GaN layer. Although it is possible to separate the first electrode into the region in which the microbump is formed and the probe region, the first electrode is preferably not separated with the two regions disposed contiguous to each other, which allows a more accurate characteristic test to be performed.

The second electrode may be formed to include an opening through which light is emitted from the light-emitting element. This allows light emitted through the opening to reach a detector positioned above such that the intensity and wavelength of the light are measured thereby. Preferably, the opening formed in the second electrode is configured as a circle having a diameter of 20 μm or less or a polygon included in the circle. This is because, if the opening is excessively large and the second-conductivity-type semiconductor region (p-type GaN layer) is excessively thin, current in sufficient quantity cannot be injected in the active layer and a sufficient amount of light cannot be obtained, which leads to degraded brightness. Conversely, a sufficient amount of light cannot also be obtained if the opening is excessively small, so that it is appropriate to form a plurality of openings in a mesh pattern.

A conductive transparent electrode may be formed in the opening formed in the second electrode to make an ohmic contact with the second-conductivity-type semiconductor region. This achieves current injection in the InGaN active layer and emission of light.

It will easily be appreciated that the opening need not be formed any more if it is possible to change the position of the detector of the prober and place it under the wafer.

The substrate may be made of a material transparent under the light emitted from the light-emitting element. This permits the light emitted from within the element to be obtained from the substrate side and efficient emission of light with a flip-chip structure. In the case where the light-emitting element is made of a GaN-based compound semiconductor, the substrate is preferably made of sapphire. Since an excellent crystallographic compatibility is observed between a GaN crystal and a sapphire crystal and the sapphire substrate is a transparent insulating substrate, the resulting flip-chip light-emitting element is excellent in the property of emitting light including blue light. The sapphire substrate is also superior and convenient in terms of light-emitting efficiency since the refractive index of the sapphire substrate, which is 1.77, is between the refractive index of GaN, which is 2.1, and the refractive index of a mold resin, which is 1.5.

Referring now to the accompanying drawings, the light-emitting element according to each of the embodiments of the present invention will be described.

Embodiment 1

Figure 2:
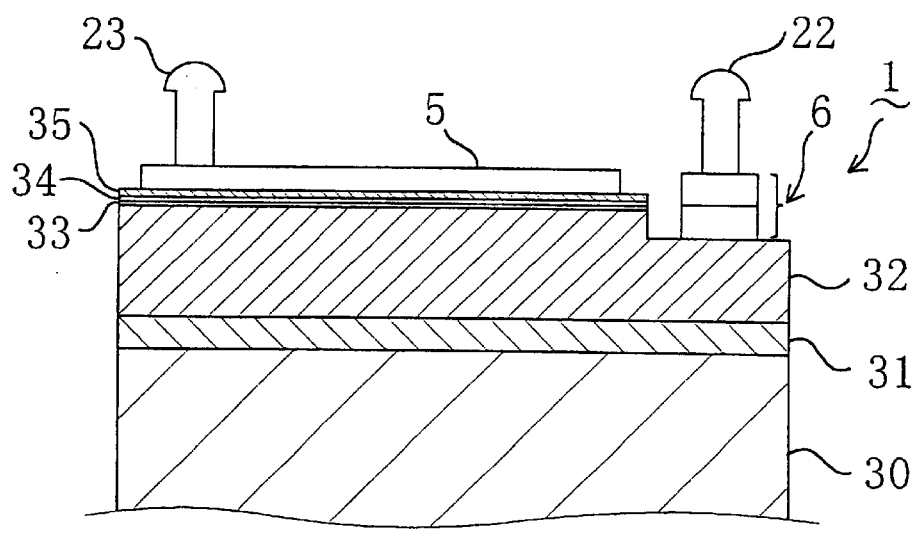
FIG. 2 is a cross-sectional view of the gallium-nitride-based compound semiconductor light-emitting element according to the first embodiment, which is taken along the line A—A of FIG. 1.

FIG. 1 is a plan view of a GaN LED element 1 according to the present embodiment and FIG. 2 is a cross-sectional view taken along the line A—A thereof. As shown in the drawings, the GaN LED element 1 has a double heterostructure comprising a GaN buffer layer 31, an n-type GaN layer 32, an InGaN active layer 33, a p-type AlGaN layer 34, and a p-type GaN layer 35 which are stacked sequentially in layers on the top face of a sapphire substrate 30. The top face of the n-type GaN layer 32 has a stepped configuration consisting of an upper-level portion occupying the major part of the top face and a lower-level portion occupying the remaining minor part thereof. An n-side electrode 6 made of a Ti/Au multilayer film and a Ni/Au multilayer film laminated thereon is formed in stacking relation on the top face of the lower-level portion of the n-type GaN layer 32. The aforesaid InGaN active layer 33, p-type AlGaN layer 34, and p-type GaN layer 35 are stacked sequentially in layers on the top face of the upper-level portion of the n-type GaN layer 32. A p-side electrode 5 made of Ni and Au is disposed directly on the top face of the p-type GaN layer 35 with no intervention of a transparent electrode for current diffusion. The GaN LED element 1 according to the present embodiment is typically configured as a square with sides on the order of 0.28 mm. Microbumps 22 and 23 made of Au or an Au alloy are formed on the n-side electrode 6 and on the p-side electrode 5, respectively.

Figure 3:
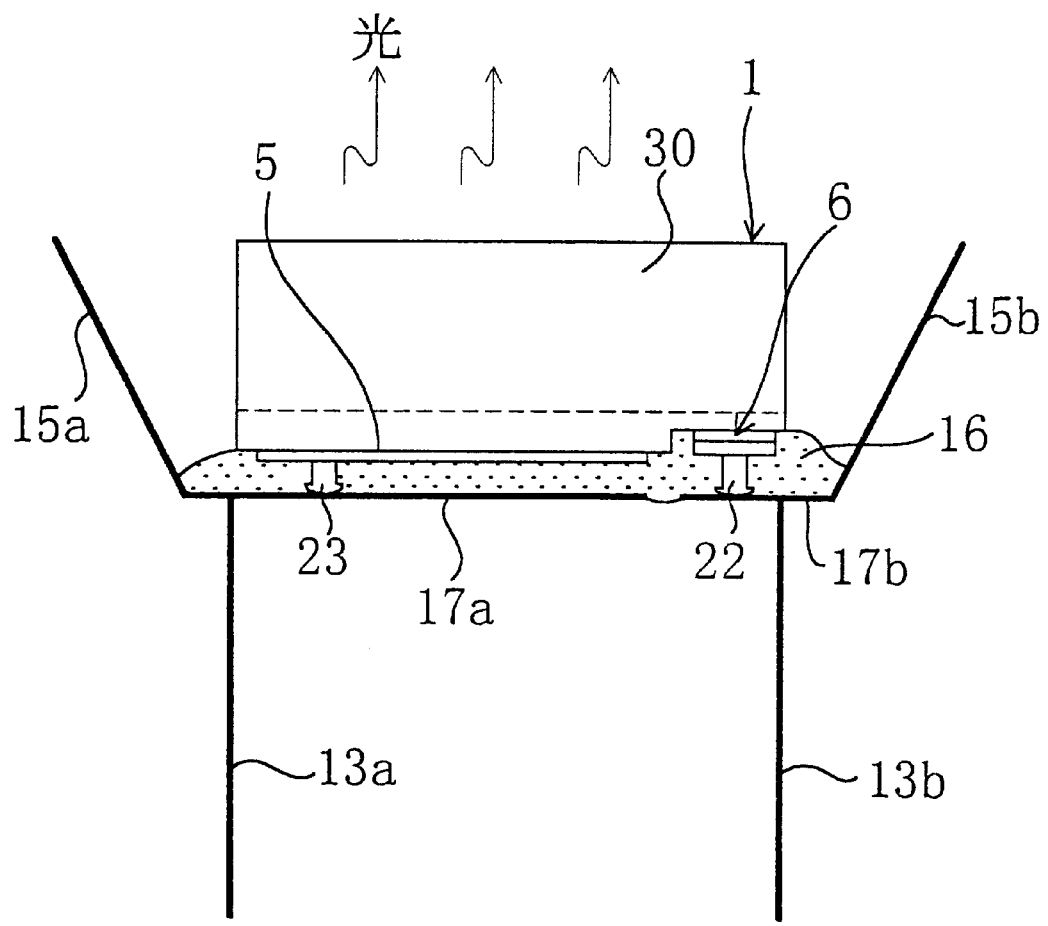
FIG. 3 is a cross-sectional view of an LED device obtained by mounting the gallium-nitride-based compound semiconductor light-emitting element according to the first embodiment on a leadframe by a microbump bonding method.

FIG. 3 is a cross-sectional view schematically showing an LED device formed by mounting the GaN LED element 1 on leadframes by a microbump bonding method. Two die pads 17a and 17b insulated and separated from each other are provided on the respective tips of the leadframes 13a and 13b. The GaN LED element 1 is mounted on the die pads 17a and 17b with the microbumps 23 and 22 in contact with the respective die pads 17a and 17b. The GaN LED element 1 is fixed to the die pads 17a and 17b with a UV curable insulating resin 16.

Light emitted from a light-emitting region is reflected upward by the leadframe 13a, transmitted by the sapphire substrate 30, and obtained from above. The respective side ends of the leadframes 13a and 13b are provided with reflectors 15a and 15b for upwardly reflecting light leaking laterally of the GaN LED element 1.

A method of manufacturing the LED device according to the present embodiment will be described below.

The description will be given first to a method of fabricating the LED element.

As stated previously, the wafer having the double heterostructure including the GaN buffer layer 31, the n-type GaN layer 32, the InGaN active layer 33, the p-type AlGaN layer 34, and the p-type GaN layer 35 stacked sequentially in layers is formed on the top face of the sapphire substrate 30. A $SiO_2$ resist mask with an opening corresponding to a region to be selectively removed is formed on the surface of the p-type GaN layer 35 of the wafer. Then, dry etching is performed by using the $SiO_2$ mask to selectively and partially remove each of the p-type GaN layer 35, the p-type AlGaN layer 34, the InGaN active layer 33 in the vertical direction. Subsequently, the n-type GaN layer 32 is recessed from the surface thereof to a slightly lower level, whereby the whole structure is formed into the stepped configuration.

The description will be given next to an exemplary procedure for forming the p-side electrode 5, the n-side electrode 6, and the microbumps 22 and 23 on the GaN LED element 1.

To form the n-side electrode 6 on the top face of the n-type GaN layer 32, a Ti film with a thickness of about 0.2 $\mu$m and an Au film with a thickness of about 0.5 $\mu$m are stacked in this order by a lift-off method or an etching method. The resulting multilayer film is then patterned into a circular configuration having a diameter on the order of 50 $\mu$m. A Ni film with a thickness of about 0.2 $\mu$m is further formed over the entire surface of the wafer, followed by an Au film with a thickness of about 1 $\mu$m formed thereon by vapor deposition. Thereafter, a resist mask with openings corresponding to the respective regions, in which the microbumps are formed, is formed over the Ni/Au multilayer film by a photolithography process step. The regions in the openings of the resist masks are selectively plated with Au or an Au alloy so that the mushroom-shaped microbumps 22 and 23 each having a diameter of 30 $\mu$m and a height of 20 $\mu$m are formed to overlie the n-side and p-side electrodes 6 and 5, respectively. After that, the Ni film and the Au film are selectively etched away except for the portions thereof covering substantially entirely the p-type GaN layer 35 and covering the n-side electrode.

The description will be given next to the procedure for mounting the GaN LED element 1 on the leadframes 13a and 13b.

The GaN LED element 1 is opposed to the die pads 17a and 17b of the leadframes 13a and 13b with the face thereof, on which the microbumps 22 and 23 are formed, facing downward and with the back face of the sapphire substrate 30 facing upward, e.g., in a flip-chip configuration. The microbump 23 on the p-side electrode 5 is aligned with the die pad 17a, while the microbump 22 on the n-side electrode 6 is aligned with the die pad 17b. The UV curable insulating resin 16 is then applied to the die pads 17a and 17b or to the GaN LED element 1 and cured under the radiation of UV light, while the GaN LED element 1 is pressed against the die pads 17a and 17b. It is also possible to cut off the die pads 17a and 17b after the mounting of the GaN LED element 1.

In the LED device internally provided with the GaN LED element 1 according to the present embodiment, the p-side electrode 5 and the n-side electrode 6 are formed on one side thereof and the microbumps 22 and 23 are formed on the p-side and n-side electrodes 5 and 6, respectively. By thus connecting the GaN LED element 1 to such members as leadframes via the microbumps 22 and 23, the following effects can be achieved.

In general, a microbump can easily be scaled down to have a diameter on the order of 10 $\mu$m, which eliminates the necessity for a bonding pad that has been required by a conventional element. Consequently, the electrode structure can be miniaturized and the light-emitting element (the GaN LED element 1 in the present embodiment) can be reduced in size. Owing to the size reduction, the amount of a costly material used in the sapphire substrate 30 or a compound semiconductor substrate is also reduced, resulting in lower cost. Moreover, since the n-side electrode 6 can also be reduced in size, the light-emitting region within the GaN LED element 1, i.e., a pn junction region is enlarged, so that higher brightness is achieved than in the conventional element of the same size. Furthermore, since the back face of the sapphire substrate, opposite to the face on which the electrodes 5 and 6 are formed, serves as the light-emitting face and light is emitted therefrom in the direction indicated by the arrows in FIG. 3, improved light-emitting efficiency is achieved in the absence of members preventing light emission such as the electrode.

The description will be given to a preferred configuration of the microbump characterizing the present embodiment. As stated previously, each of the microbumps 22 and 23 has a diameter preferably in the range of 5 to 300 $\mu$m and, more preferably, in the range of 5 to 100 $\mu$m. If each of the microbumps 22 and 23 has a diameter exceeding 100$\mu$m, the area occupied thereby is increased so that flip-chip bonding has no more advantage over wire bonding. Most preferably, the diameter of the microbump is in the range of 10 to 30$\mu$m. If each of the microbumps 22 and 23 has a columnar configuration, the height thereof is preferably 30 $\mu$m or less. If each of the microbumps 22 and 23 has a mushroom-like configuration, on the other hand, the height thereof is preferably 50 $\mu$m or less. This is because a thick resist film is required to form the columnar microbumps by a selective plating technique, but it is difficult to form a resist film with a thickness of 30 $\mu$m or more by the photolithography process step. If plating is performed to reach a height exceeding 50 $\mu$m to form the mushroom-shaped microbumps, on the other hand, the diameter of the cap portion of the mushroom-shaped microbump is increased laterally to the order of 100 $\mu$m, so that flip-chip bonding has only reduced advantages over wire bonding.

Preferably, the n-side electrode 6 is formed to have a circular cross section of such a size as to allow the formation of the microbump 22 thereon, i.e., with a diameter slightly larger than the diameter of the columnar microbump. In the case where the diameter of the microbump is on the order of 30 $\mu$m, e.g., the n-side electrode 6 is formed to have a circular cross section with a diameter on the order of 50 $\mu$m suitably for the scaling down of the LED element. It will easily be appreciated that the transverse cross section of the microbump is not necessarily be circular as in the present embodiment but may be oval or generally square. In that case, the lateral maximum dimension is appropriately in the foregoing range for the diameter.

Since the back face of the sapphire substrate 30 serves as the light-emitting face, it is no more necessary to form a transparent electrode on the p-side electrode 5 as in the conventional GaN LED element. Consequently, it is also possible to provide the p-side electrode made of a thick film over the entire surface of the p-type GaN layer 35.

The LED element fabricated in accordance with the foregoing method is typically configured to have a square cross section with 0.28 mm sides in which the area surrounding the n-side electrode and not contributing to light emission accounts for 1/15 of the surface area of the element. The conventional element is typically configured to have a square cross section with 0.34 mm sides in which the area not contributing to light emission accounts for 1/2 of the surface area of the element. In short, the element according to the present embodiment has a light-emitting area 1.26 times larger than that of the conventional element, though it has an element size 0.68 times smaller than that of the conventional element.

In the manufacturing method according to the present embodiment, since metal used only in the p-side electrode (Ni and Au) is further laminated on metal used only in the n-side electrode (Ti and Au) and the top face of the metal used only in the p-side electrode is selectively plated with metal composing the microbump, the conditions for selective plating are equalized. As a result, the p-side electrode 5 is made of the metal used only in the p-side electrode, while the n-side electrode 6 is made of the metal used only in the n-side electrode and the metal used only in the p-side electrode laminated thereon. Consequently, a difference in level between the top face of the p-type GaN layer 35 and the n-type GaN layer 32 is reduced advantageously so that the tips of the two microbumps 22 and 23 are on substantially the same level. However, the method of manufacturing the light-emitting element according to the present invention is not limited to such an embodiment. Each of the p-side electrode and the n-side electrode may be made of the metal used only therein. A method of depositing metal composing the microbumps is not limited to selective plating, either. It is also possible to deposit a metal film by vapor deposition or like method and remove the metal film surrounding the microbumps together with the resist film to leave only the microbumps.

Although the GaN LED element is mounted on the leadframes in the foregoing embodiment, the present invention is not limited thereto. For example, it is also possible to mount the GaN LED element on an active element, a passive element, or a base substrate by flip-chip connection or alternatively mount other active and passive elements on the GaN LED element by flip-chip connection.

The light-emitting element according to the present invention is not limited to the GaN LED element but may be another light-emitting element. However, since the GaN LED element is formed on a transparent and insulating sapphire substrate and the p-side electrode and the n-side electrode are formed on one side thereof, it can exert remarkable effects if the present invention is applied thereto.

The substrate of the light-emitting element according to the present invention is not necessarily transparent because, if the substrate is opaque, it is sufficient to obtain light from the opposite side of the substrate. However, the substrate made of a transparent material improves light-emitting efficiency, as described above, since it allows light to be obtained from the side opposite to the p-side and n-side electrodes.

In the process step of a probe test for testing the characteristics of the GaN LED element and in the assembly process step for dividing the wafer into individual chips and mounting them on leadframes or the like, there are possibilities that the following problems occur, which can be subdivided into three types.

The first type of problems occur in the assembly process. In the case of dividing the wafer, in which GaN LED elements are formed, into individual chips (in each of which one GaN LED element is formed) and mounting each of the chips on leadframes or the like, the arms of a die bonder or the like recognize the chip placed with the microbumps facing downward and come to pick it up. In that case, however, the chip supported by the two microbumps is likely to tilt, which may lead to trouble associated with the chip recognition and pick-up operation performed by the arms. On the other hand, if the chip is bonded to leadframes or the like via the microbumps in accordance with a method in which the Au microbumps are welded and bonded with the application of load, heat, and ultrasonic waves, the microbumps of reduced heights may result in an undesired contact between the chip and the leadframes at a portion in which the microbumps are not formed. Such an undesired contact causes the problems of a short-circuit failure and the peeling off of the electrode due to the ultrasonic wave.

The second type of problems occur in the process step of a probe test. As stated above, the light-emitting area can be maximized when the n-side electrode 6 of the GaN LED element is in minimum size. For this purpose, the electrode is preferably sized to allow one columnar or mushroom-shaped microbump with a diameter on the order of 30 $\mu$m to be formed thereon. In this case, the n-side electrode 6 is preferably configured as a circle having a diameter on the order of 60$\mu$m. However, the microbump may be destroyed by a probe needle in contact therewith in the process step of a probe test for testing the characteristics of the element.

The third type of problems also occur in the process step of a probe test. In the case of performing a probe test by means of a normal prober, a wafer, in which GaN LED elements are formed, are placed on a stage with the electrodes facing upward and fixed with a vacuum chuck. The characteristics of the element are tested by bringing the probe needle into contact with the electrodes from above the wafer. However, since light is obtained from the back face of the sapphire substrate of the GaN LED element and a detector for measuring the intensity and wavelength of light is disposed above the stage, the amount of light reaching the detector positioned above the stage may be insufficient.

The following embodiment relates to a light-emitting element with a flip-chip structure, in which microbumps are formed and which allows the test process and the assembly process to be performed without trouble.

Embodiment 2

Figure 6A:
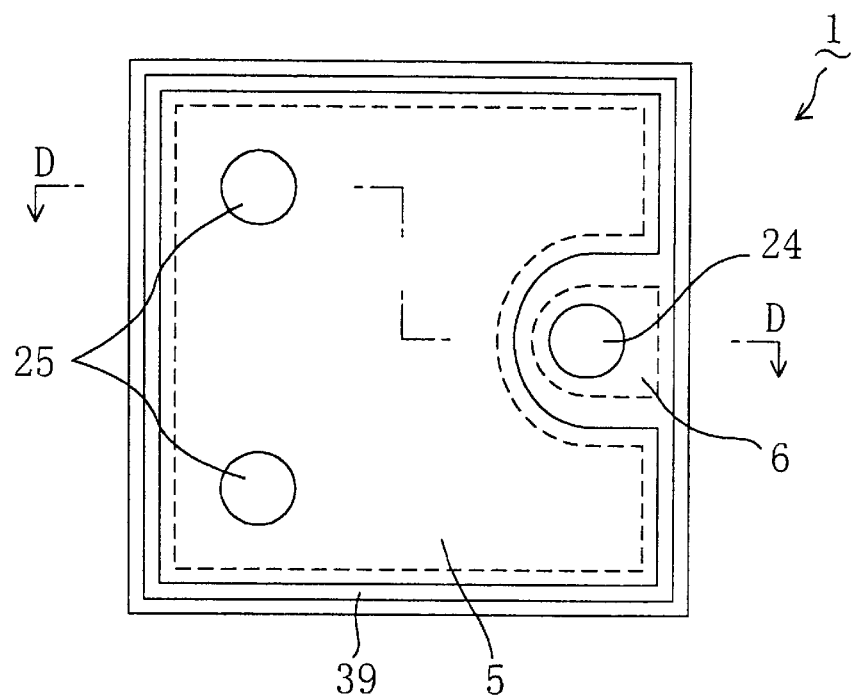
FIG. 6A is a plan view showing the structure of a GaN LED element according to a second embodiment of the present invention and FIG. 6B is a cross-sectional view taken along the line D—D thereof.
Figure 6B:
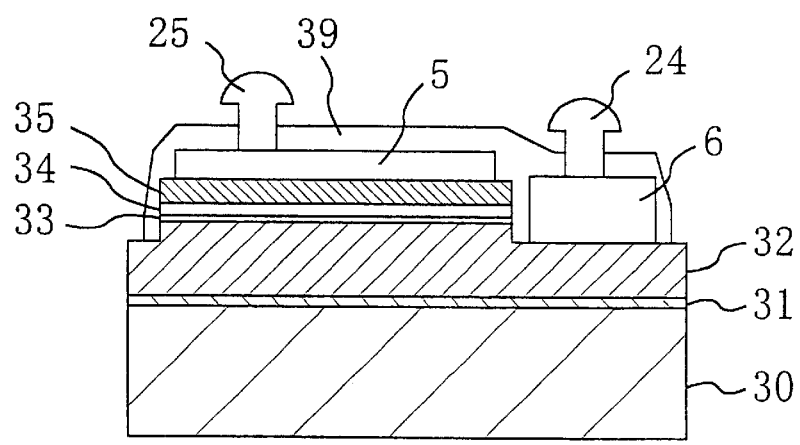

FIG. 6A is a plan view of a GaN LED element 1 according to the present embodiment and FIG. 6B is a cross-sectional view taken along the line D—D thereof. The present embodiment is characterized in that one dotted microbump is formed on the n-side electrode 6 of the GaN LED element 1 and that two dotted microbumps are formed on the p-side electrode 5 thereof.

Referring to FIGS. 6A and 6B, a detailed description will be given to the structure. As shown in the drawings, the GaN LED element 1 has a double heterostructure including a GaN buffer layer 31, an n-type GaN layer 32, an InGaN active layer 33, a p-type AlGaN layer 34, and a p-type GaN layer 35, which are stacked sequentially in layers on the top face of a sapphire substrate 30. The top face of the n-type GaN layer 32 has a stepped configuration consisting of a upper-level portion occupying the major part of the top face and a lower-level portion occupying the remaining minor part thereof. An n-side electrode 6 made of a Ti/Au multi-layer film and a Mg/Au multilayer laminated thereon is formed on the top face of the lower-level portion of the n-type GaN layer 32. The aforesaid InGaN layer 33, p-type AlGaN layer 34, and p-type GaN layer 35 are stacked sequentially in layers on the top face of the upper-level portion of the n-type GaN layer 32. A p-side electrode 5 made of Mg and Au is provided directly on the top face of the p-type GaN layer 35 with no intervention of a transparent electrode. One dotted microbump 24 made of Au or an Au alloy is formed on the top face of the n-side electrode 6, while two dotted microbumps 25 made of Au or an Au alloy are formed on the top face of the p-side electrode 5. The entire surface of the element is covered with a protective film 39 except for the microbumps.

Each of the three dotted microbumps has a mushroom-like or columnar configuration with a diameter of 40 µm and a height of 20 µm. The three microbumps are positioned to form the three vertices of the largest isosceles triangle that can be included in the chip.

In the arrangement, the chip with the GaN LED element 1 is supported at three points by the microbumps and prevented from tilting even in the case where it is placed with the microbumps facing downward. Consequently, no chip recognition error or arm pick-up error occurs during die bonding.

By setting the height of the microbump at 20 µm, the process step of bonding the chip with the GaN LED element 1 to leadframes or the like with the application of lead, heat, and an ultrasonic wave under proper bonding conditions is free from a short-circuit failure resulting from an undesired contact between the chip and the leadframe at a portion other than the bumps, while a sufficient bonding strength is maintained.

Moreover, since Ti used in the n-side electrode and Mg used in the p-side electrode are materials exhibiting excellent adhesion to GaN, no peeling due to the ultrasonic wave was observed.

Embodiment 3

Figure 7A:
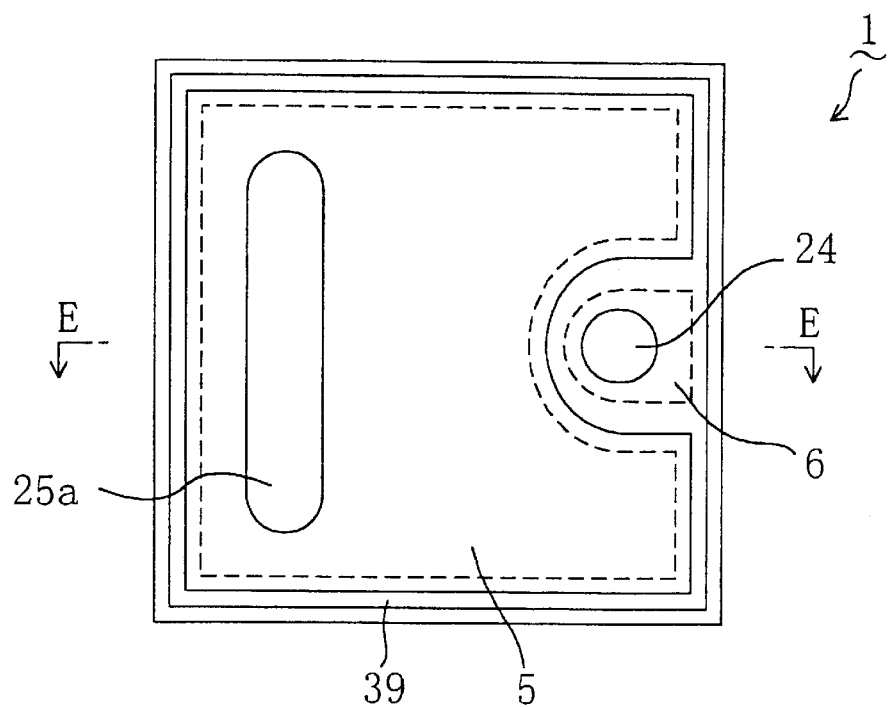
FIG. 7A is a plan view showing the structure of a GaN LED element according to a third embodiment of the present invention and FIG. 7B is a cross-sectional view taken along the line E—E thereof.
Figure 7B:
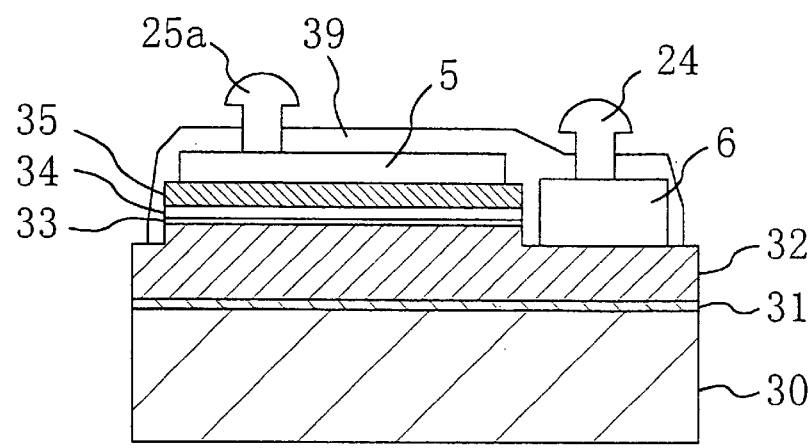

FIG. 7A is a plan view of a GaN LED element 1 according to the present embodiment and FIG. 7B is a cross-sectional view taken along the line E—E thereof. The present embodiment is characterized in that one dotted microbump 24 is formed on the n-side electrode 6 of the GaN LED element 1 and that one linear microbump 25a is formed on the p-side electrode 5 thereof. As for the other components, they are the same as in the second embodiment.

The linear microbump 25a on the p-side electrode 5 has a width of 20 µm, a length of 80 µm, a height of 20 µm, and a mushroom-shaped or columnar cross section taken along the line E—E.

In this case also, no chip recognition error or arm pick-up error occurs during die bonding since the chip with the GaN LED element 1 is supported by the microbumps and thereby prevented from tilting.

Embodiment 4

Figure 8A:
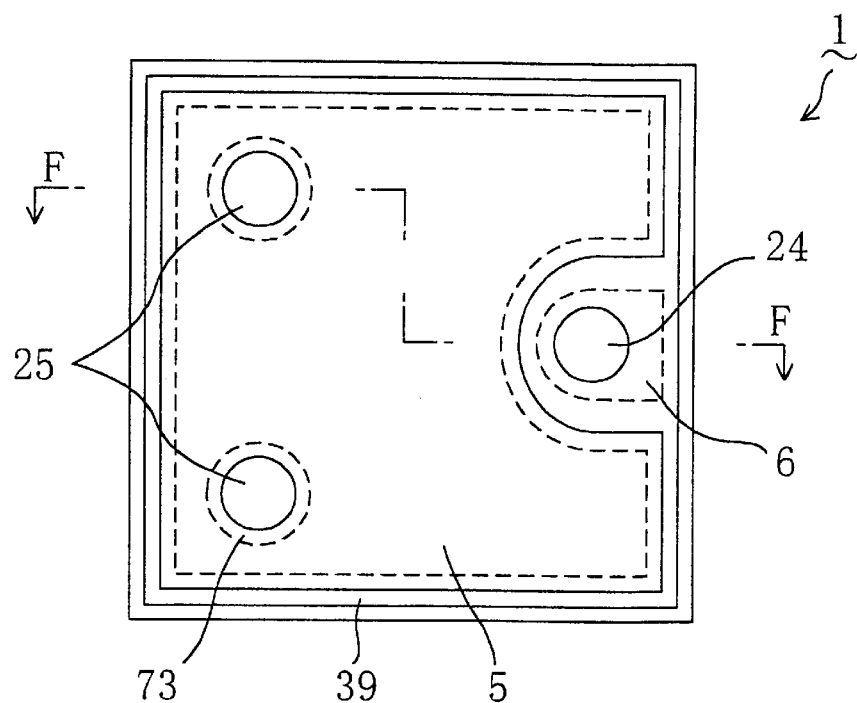
FIG. 8A is a plan view showing the structure of a GaN LED element according to a fourth embodiment of the present invention and FIG. 8B is a cross-sectional view taken along the line F—F thereof.
Figure 8B:
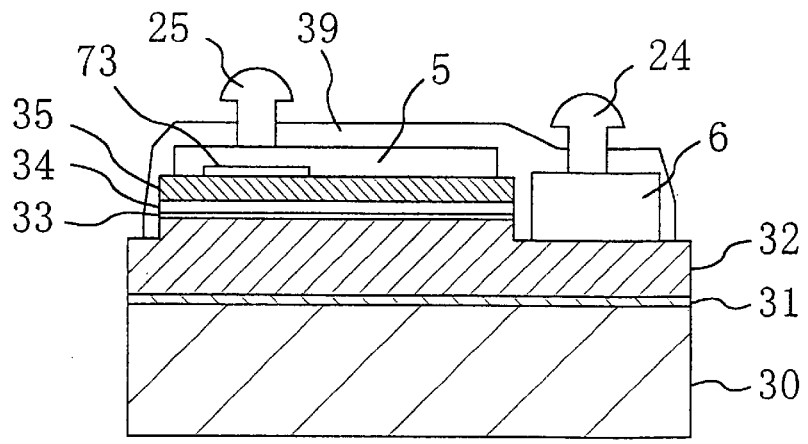

FIG. 8A is a plan view of a GaN LED element 1 according to the present embodiment and FIG. 8B is a cross-sectional view taken along the line F—F thereof. The present embodiment is characterized in that metal having excellent adhesion to the p-type GaN layer is placed under the p-side electrode to correspond to the microbumps disposed on the GaN LED element 1. As for the other components, they are the same as in the second embodiment.

In the case where a multilayer film of Ni, Au, or the like is used as a material composing the p-side electrode 5, Ni having poor adhesion to the GaN layer and forming the interface with the p-type GaN layer underlying the p-side electrode 5 peels off at portions corresponding to the microbumps 25 and their vicinities due to an ultrasonic wave used along with load and heat in the process step of welding and bonding the microbumps to leadframes or the like. To prevent this, metal 73 with excellent adhesion such as Ti is effectively placed at portions corresponding to the microbumps 25 and their vicinities to underlie the p-side electrode 5, which prevents peeling in the bonding process step and maintains sufficient bonding strength.

Although the present embodiment has described the process step in which the microbumps is welded with the application of load, heat, and ultrasonic wave as an exemplary method of bonding the chip to leadframes or the like, the bonding method is not limited thereto. The present embodiment is also applicable to, e.g., a stud bump bonding (SBB) method, to an ACF method using an anisotropic conductive sheet or adhesive, and to a method using solder bumps.

Embodiment 5

Figure 9A:
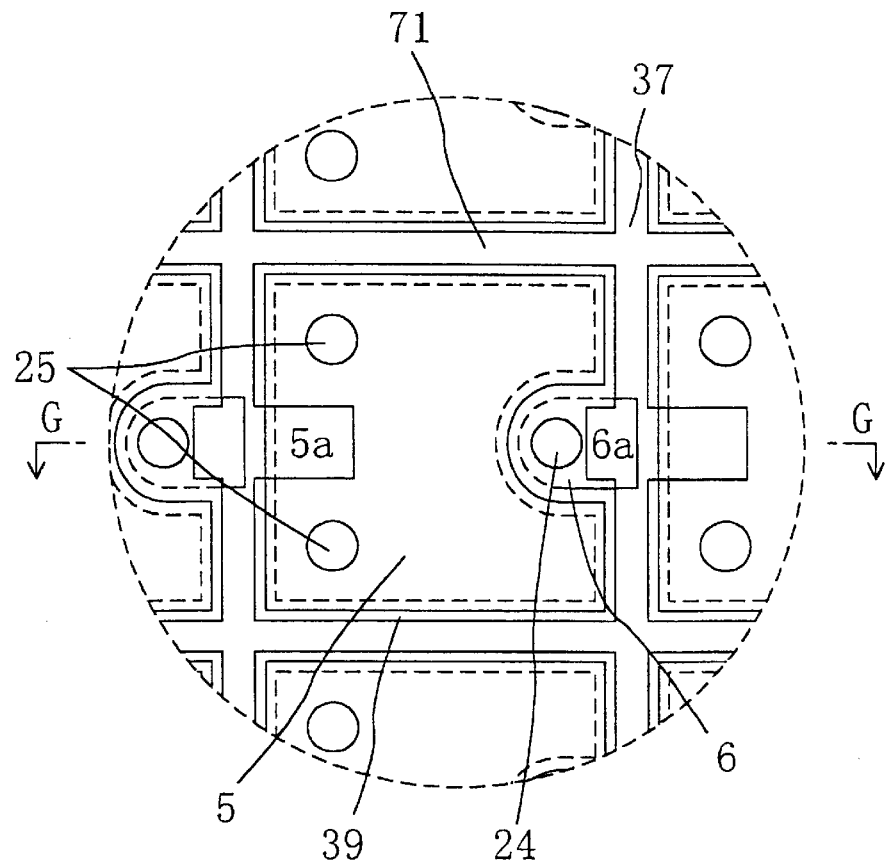
FIG. 9A is a plan view showing the structure of a GaN LED element according to a fifth embodiment of the present invention and FIG. 9B is a cross-sectional view taken along the line G—G thereof.
Figure 9B:
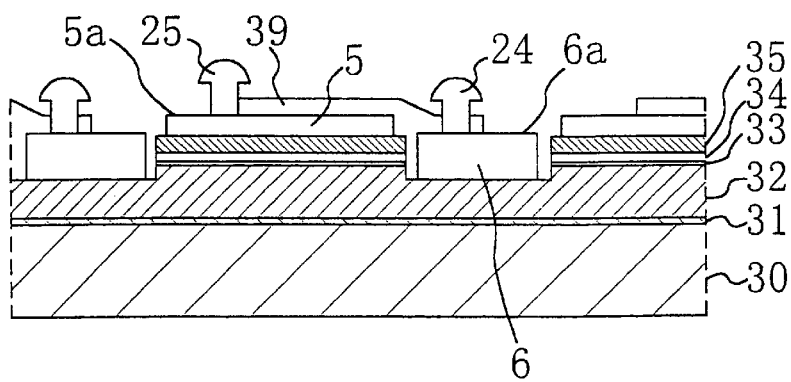

FIG. 9A is a plan view of a part of a group of GaN LED elements formed on a 2-inch wafer according to the present embodiment and FIG. 9B is a cross-sectional view taken along the line G—G thereof. The present embodiment is characterized in that the top faces of the p-side and n-side electrodes 5 and 6 of the GaN LED element 1 are provided with respective probe regions. In particular, the probe region provided in the top face of the n-side electrode is formed to extend over a dicing street.

In FIG. 9A, the n-side electrode 6 is formed on the top face of the lower-level portion of the n-type GaN layer 32 so as to extend over a part of a dicing street 37. On the other hand, the p-side electrode 5 is formed over the substantially entire top face of the p-type GaN layer 35. The microbumps 24 and 25 each made of Au or an Au alloy are formed on the n-side and p-side electrodes 6 and 5, respectively. The surface of the element is coated with the protective film 39 including respective openings corresponding to the Au bump 25 on the p-side electrode 5, a probe region 5a provided in the top face thereof for contact with a probe needle, the Au bump 24 on the n-side electrode 6, and a probe region 6a provided in the top face thereof for contact with a probe needle. The size of the probe region 5a of the p-side electrode 5 is on the order of 70×80 µm, while the size of the probe region 6a of the n-side electrode 6 is on the order of 40×80 µm.

The probe region 6a of the n-side electrode 6 thus formed to extend over the dicing street 71 allows a probe test to be performed without damaging the microbump and maximizes the light-emitting area of the GaN LED element 1.

Embodiment 6

Figure 10:
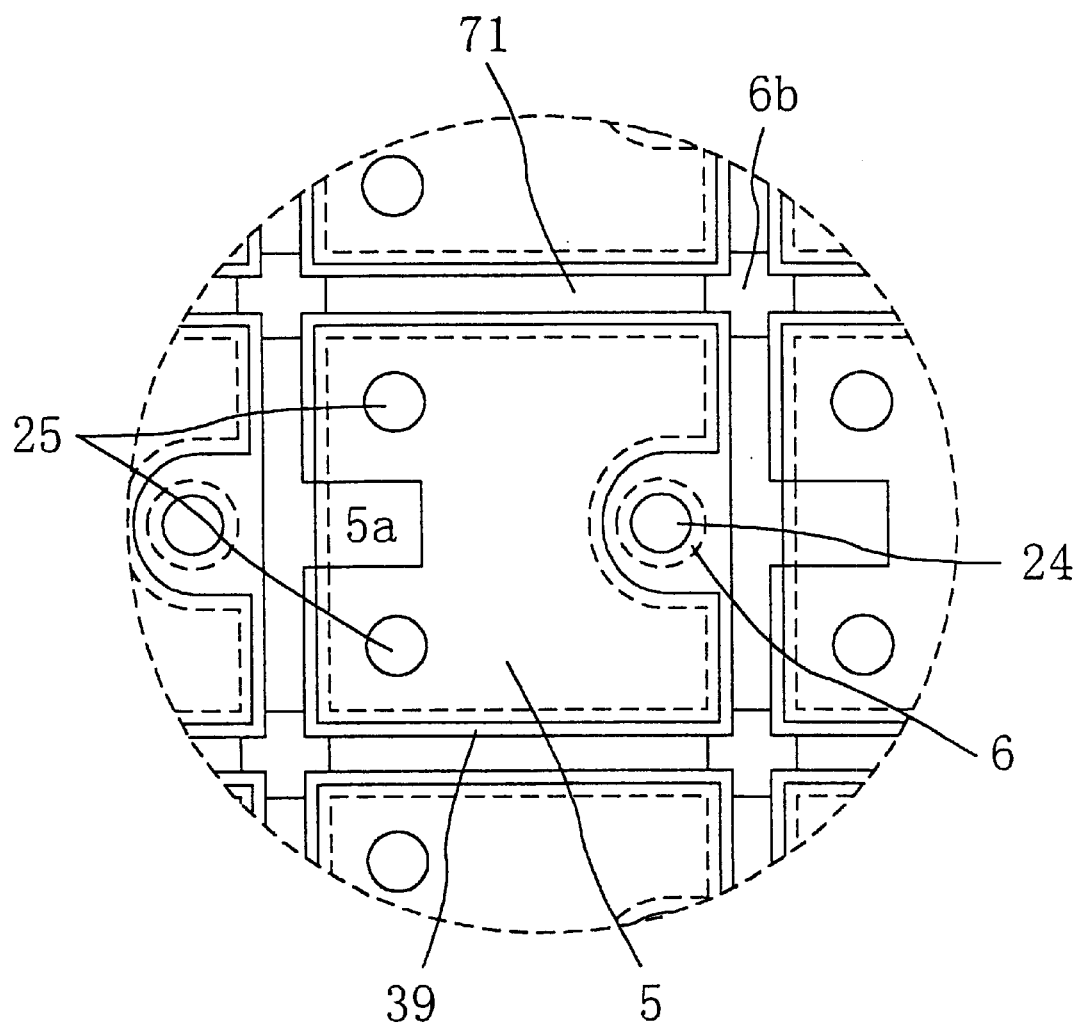
FIG. 10 is a plan view showing the structure of a GaN LED element according to a sixth embodiment of the present invention.

As shown in FIG. 10, the present embodiment is the same as the fifth embodiment except that a probe region 6b separate and distinct from the n-side electrode 6 is provided over the dicing street. Although the probe region 6b is slightly smaller in size, it allows a probe test to be performed. In this case also, the probe region 6b provided over the dicing street enlarges the light-emitting area of the GaN LED element 1. However, the probe region 6b allows a more accurate characteristic test to be performed if it is not separated from the n-side electrode 6.

Embodiment 7

Figure 11A:
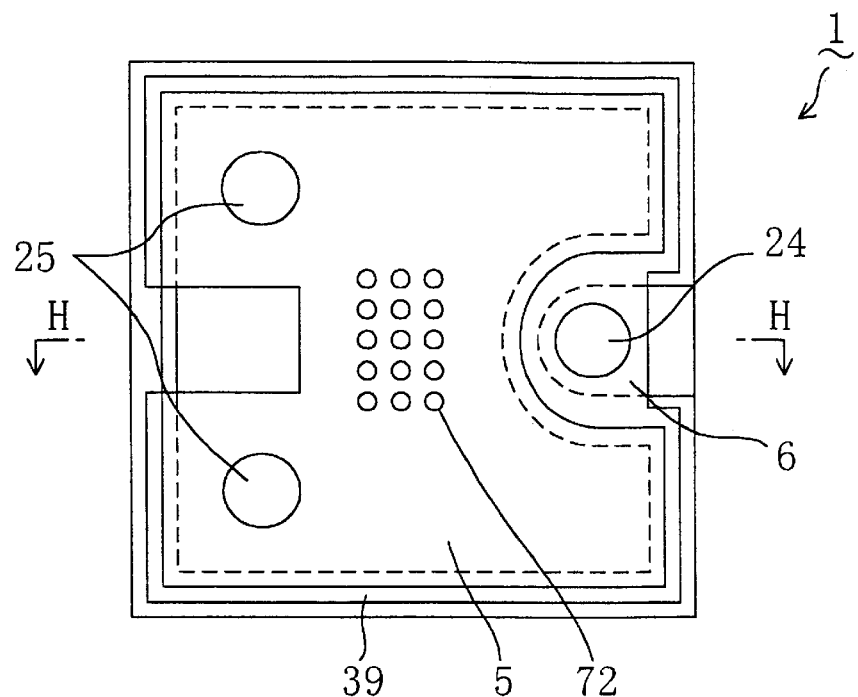
FIG. 11A is a plan view showing the structure of a GaN LED element according to a seventh embodiment of the present invention and FIG. 11B is a cross-sectional view taken along the line H—H thereof.
Figure 11B:
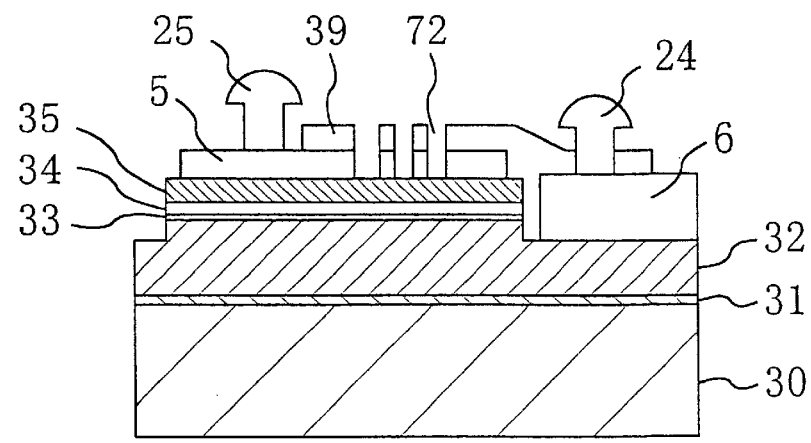

FIG. 11A is a plan view of a GaN LED element 1 according to the present embodiment and FIG. 11B is a cross-sectional view taken along the line H—H thereof. The present embodiment is characterized in that a plurality of openings 72 are formed in rows and columns in the center portion of the p-side electrode 5 of the GaN LED element 1.

Each of the openings is configured as a circle with a diameter of 10 µm. By thus arranging the openings in 5 rows and 3 columns, a sufficient amount of light required for brightness and wavelength measurement can be supplied to the detector.

The openings 72 need not necessarily be formed in the center portion of the p-side electrode 5 but may be formed in any portion of the p-side electrode provided that they can be formed therein.

Embodiment 8

Figure 12A:
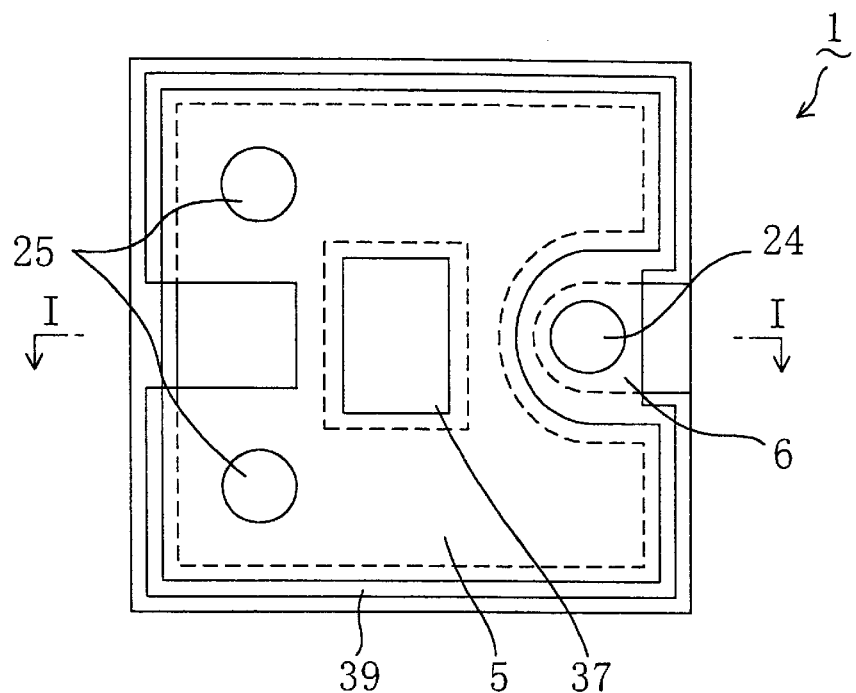
FIG. 12A is a plan view showing the structure of a GaN LED element according to an eighth embodiment of the present invention and FIG. 12B is a cross-sectional view taken along the line I—I thereof.
Figure 12B:
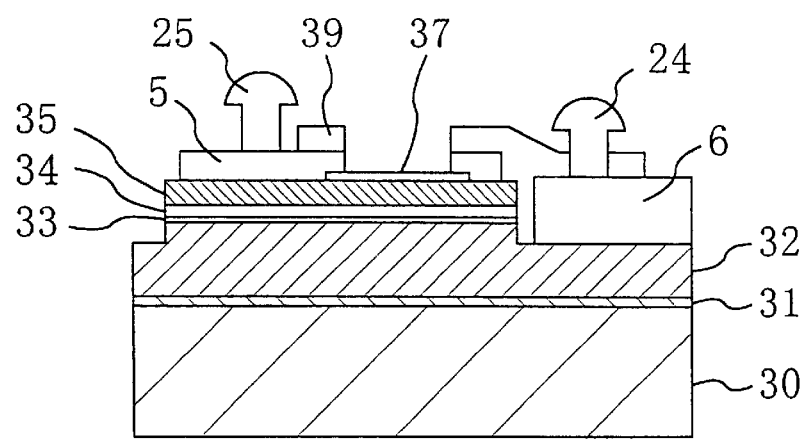

FIG. 12A is a plan view of a GaN LED element 1 according to the present embodiment and FIG. 12B is a cross-sectional view taken along the line I—I thereof. The present embodiment has been achieved by replacing the openings 72 in rows and columns according to the seventh embodiment with a transparent electrode in ohmic contact with the p-type GaN layer. In this case, the size of the transparent electrode is 50×100 μm and a sufficient amount of light can be supplied to the detector. It will easily be appreciated that the size of the transparent electrode is not limited thereto.

Semiconductor Light-Emitting Device

Figure 5:
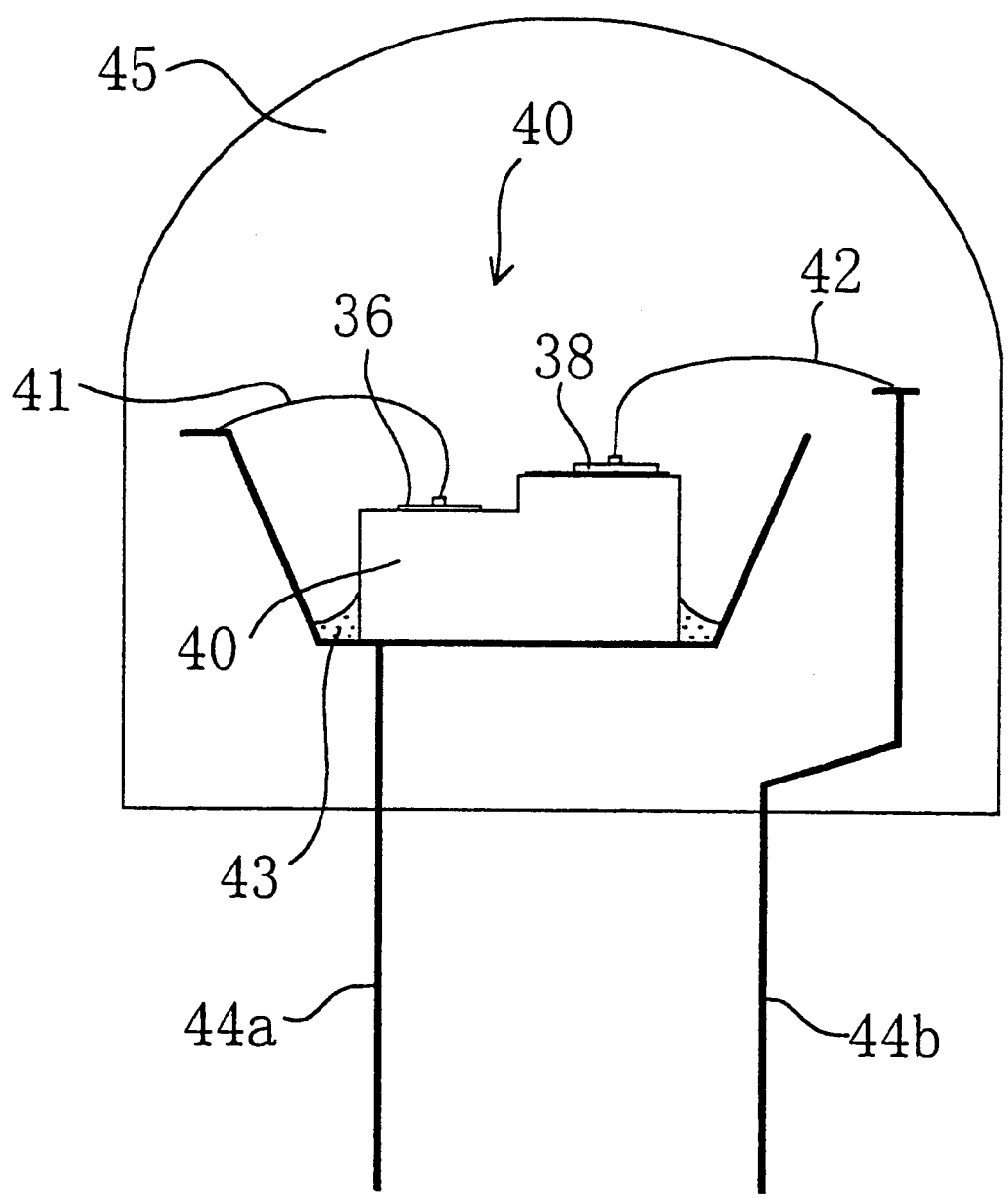
FIG. 5 is a cross-sectional view showing the structure of a conventional LED lamp which is commercially available.

In general, an LED lamp made of a semiconductor layer provided on an insulating substrate as shown in FIG. 5 is susceptible to static electricity due to the physical constant (e.g., dielectric constant ∈) of the material and structure of the element. If the LED lamp is opposed to a capacitor charged with static electricity and a discharge is caused therebetween, the LED lamp will be destroyed by an electrostatic voltage of 100 V in the forward direction and with an electrostatic voltage of 30 V in the reverse direction. Compared with an LED element made of another bulk compound semiconductor (GaP, GaAlAs, or the like), the LED lamp is destroyed by an extremely low electrostatic voltage. Unless any protective treatment is performed with respect to the LED lamp, static electricity applied from the outside to the LED may readily break down the GaN LED element within the LED lamp.

A description will be given to a highly reliable semiconductor light-emitting device internally provided with the function of preventing a destruction induced by the application of a high voltage such as static electricity.

Embodiment 9

Figure 13:
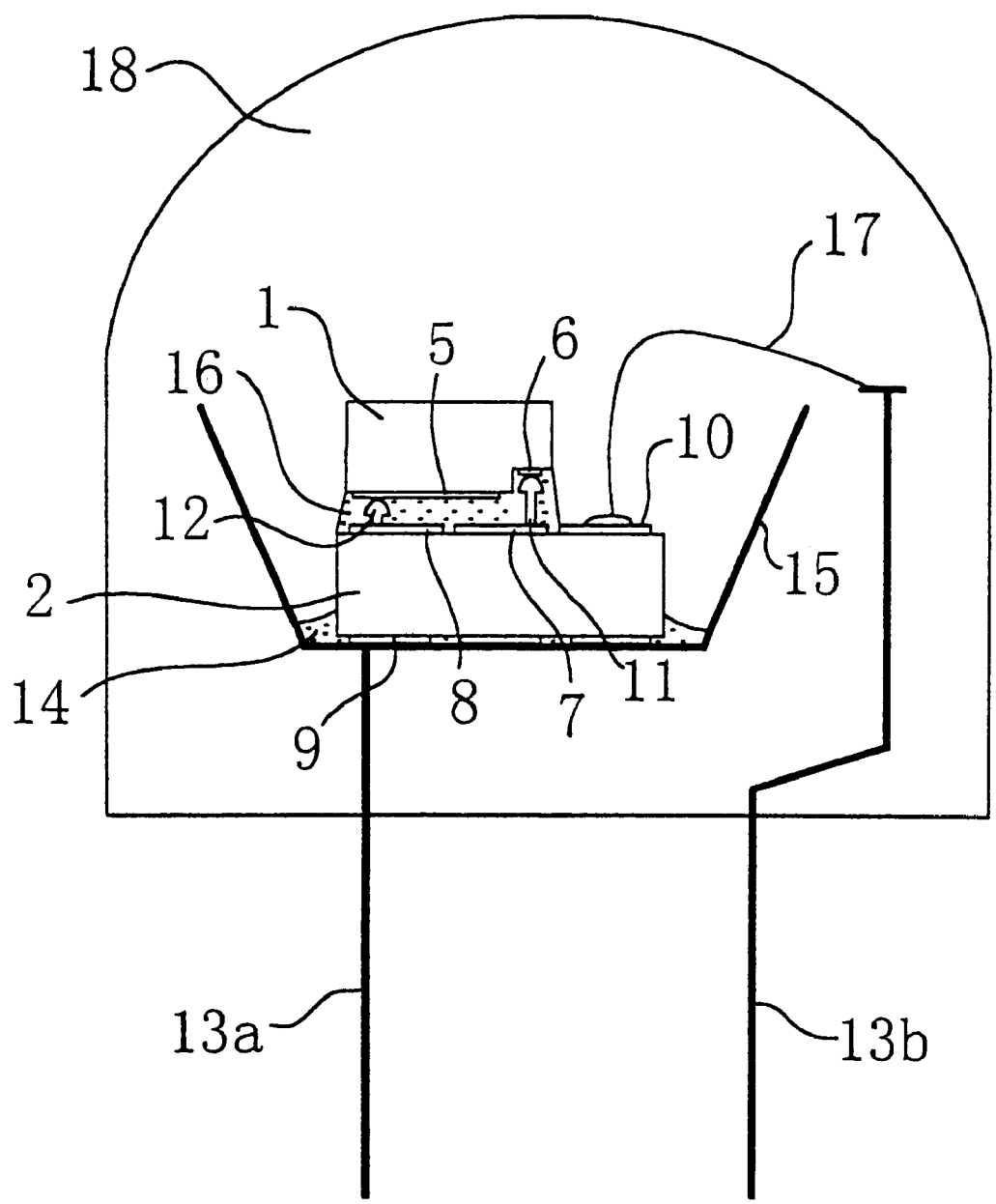
FIG. 13 is a cross-sectional view of a GaN LED lamp according to a ninth embodiment of the present invention.

FIG. 13 is a cross-sectional view of a semiconductor light-emitting device (GaN-based LED lamp) according to the present embodiment. The GaN-based LED lamp according to the present embodiment is characterized in that a GaN LED element 1 is mounted on leadframes 13a and 13b with a Si diode element 2 having p-side and n-side electrodes interposed therebetween, not directly on the leadframes.

As shown in FIG. 13, the Si diode element 2 with the main surface thereof facing upward and with the back face thereof facing downward is disposed on a die pad forming the tip of the leadframe 13a having a reflecting mirror. The Si diode element 2 is die-bonded to the die pad with an Ag paste 14, while having an n-side electrode 9 on the back face thereof in contact with the die pad of the leadframe 13a. A p-side electrode 7, an n-side electrode 8, and a bonding pad portion 10 of the p-side electrode are provided on the top face of the Si diode element 2. The GaN LED element 1 having the top face of the sapphire substrate facing downward and the p-side and n-side electrodes 5 and 6 facing downward is positioned above the Si diode element 2. The p-side and n-side electrodes 5 and 6 of the GaN LED element 1 are electrically connected to the n-side and p-side electrodes 8 and 7 of the Si diode element 2 via Au microbump 12 and 11, respectively. The GaN LED element 1 is fixed to the Si diode element 2 with a UV curable insulating resin 16. The mechanical connection between the GaN LED element 1 and the Si diode element 2 may be accomplished by welding the microbumps 11 and 12 instead of using the UV curable insulating resin 16. Such a welding process step will be described later. The bonding pad portion 10 of the p-side electrode of the Si diode element 2 is connected by wire bonding to the lead frame 13b via an Au wire 17. A reflector 15 for upwardly reflecting light is attached to a side face of the die pad of the leadframe 13a, whereby the GaN LED element 1 is surrounded.

Figure 4A:
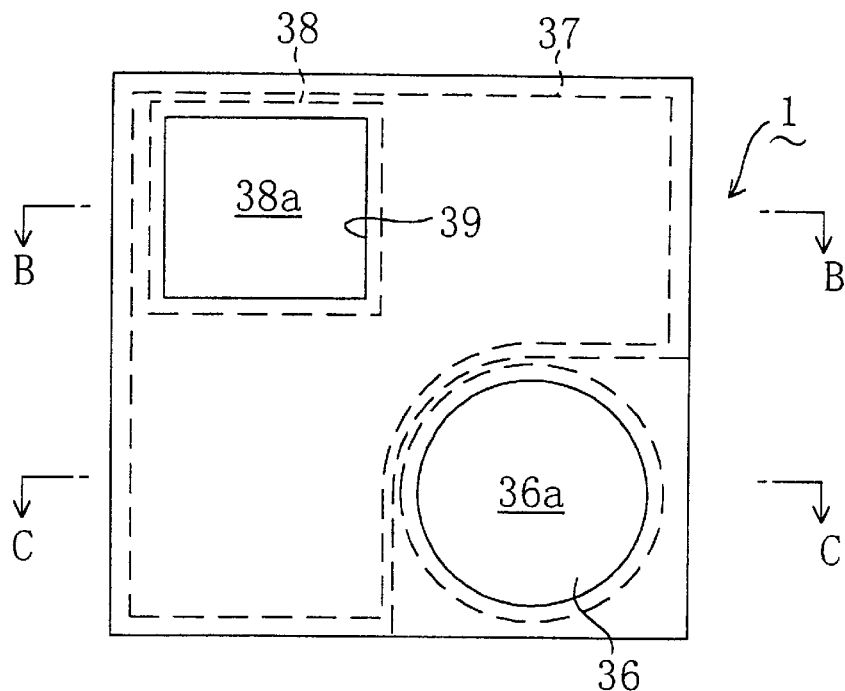
FIG. 4A is a plan view of a conventional LED element which is commercially available.
Figure 4B:
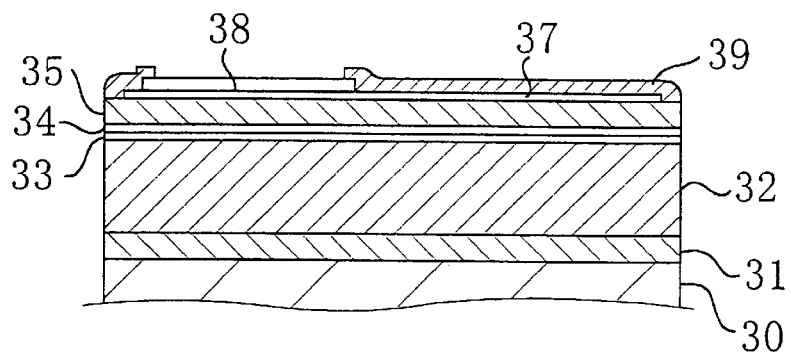
FIG. 4B is a cross-sectional view taken along the line B—B.
Figure 4C:
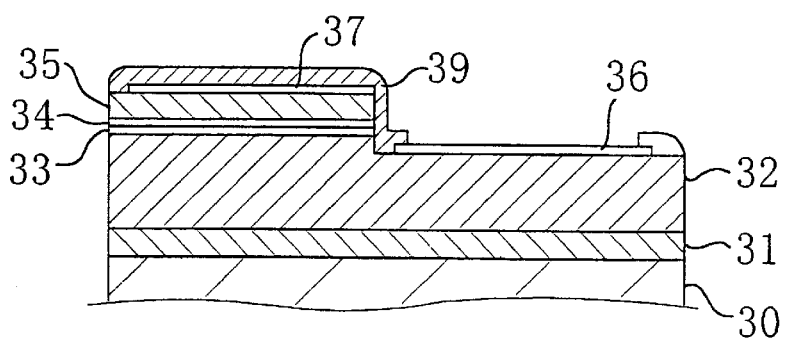
FIG. 4C is a cross-sectional view thereof taken along the line C—C thereof.

The tip portions of the leadframes 13a and 13b are entirely molded with a transparent epoxy resin 18 with the GaN LED element 1 and the Si diode element 2 mounted thereon to constitute the LED lamp. The light generated by the GaN LED element 1 is emitted upward from the back face of the sapphire substrate. As a result, such a transparent electrode for current diffusion (the member designated at the reference numeral 37 in FIGS. 4A, 4B, and 4C) as formed in the conventional GaN LED element is no more necessary. As a member for current diffusion, only the thick-film p-side electrode 5 is provided satisfactorily.

The light leaked laterally of the GaN LED element 1 is reflected upward by the reflector 15 such that the light-emitting efficiency is enhanced. For this purpose, the reflector 15 is preferably positioned to have the tip portion thereof at least higher in level than the light-emitting region of the GaN LED element 1.

Figure 14:
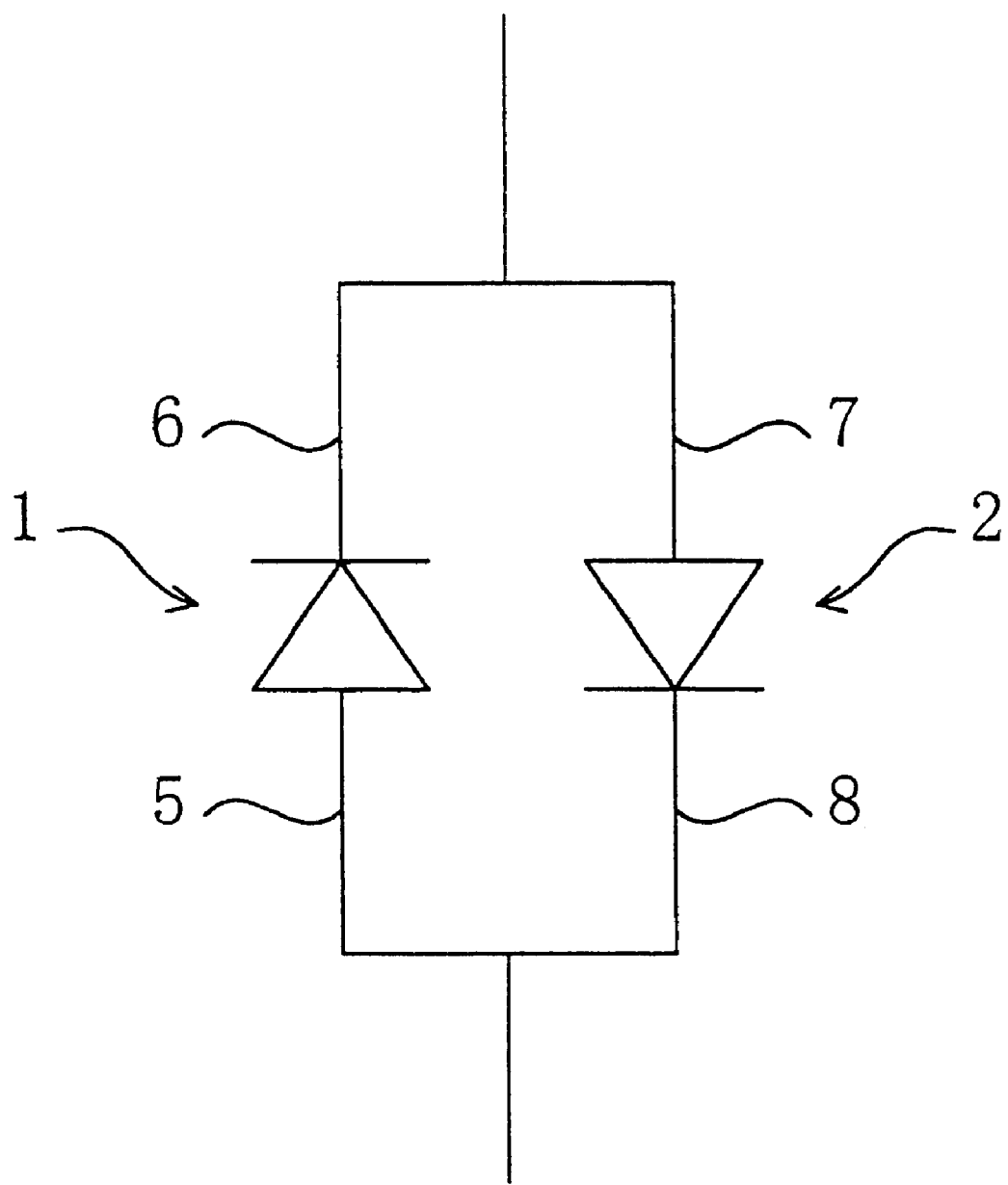
FIG. 14 is a circuit diagram for illustrating a protective circuit in the LED lamp according to the ninth embodiment.

FIG. 14 is a circuit diagram for illustrating a protective circuit provided in the LED lamp according to the present embodiment.

As shown in FIG. 14, the GaN LED element 1 is connected to the Si diode element 2 in opposite-polarity relation, i.e., the p-side and n-side electrodes of the GaN LED element 1 are connected to the n-side and p-side electrodes of the Si diode element 2 having the opposite polarities, which prevents a high voltage from being applied to the GaN LED element 1 from the leadframe side. In this case, the forward operating voltage applied to the Si diode element 2 is about 0.9 V so that the reverse voltage for the GaN LED element 1 is cut off at 0.9 V. On the other hand, since the reverse breakdown voltage for the Si diode element 2 can be set to a value in the vicinity of 10 V, the forward voltage applied to the GaN LED element 1 can also be cut off at a value in the vicinity of 10 V. As described above, since the forward and reverse breakdown voltages for the GaN LED element 1 are on the order of 100 V and 30 V, respectively, the arrangement surely prevents the destruction of the GaN LED element 1 induced by the application of a high voltage such as static electricity.

Specifically, when the forward and reverse destruction voltages for the GaN LED element 1 are represented by Vf1 and Vb1, respectively, the forward and reverse breakdown voltages for the Si diode element 2 are represented by Vf2 and Vb2, respectively, and the operating voltage for the GaN LED element 1 is represented by VF, the breakdown of the GaN LED element 1 is prevented appropriately provided that the following relationship is established:

Vf2<Vb1

Vb2<Vf1

Vb2>VF.

A description will be given next to the detailed structures of the individual components of the LED lamp according to the present embodiment and to the outline of the manufacturing process therefor.

Figure 15A:
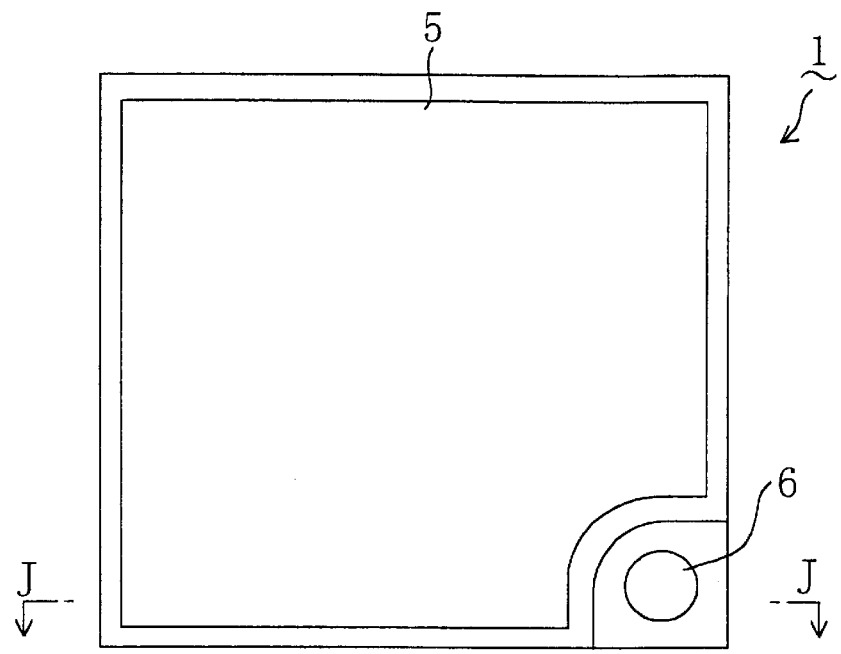
FIG. 15A is a plan view showing the structure of a GaN LED element according to the ninth embodiment and FIG. 15B is a cross-sectional view taken along the line J—J thereof.
Figure 15B:
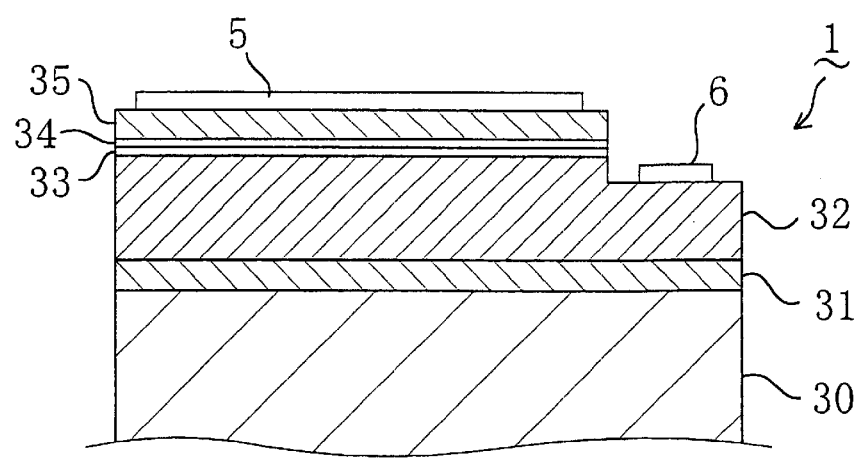

FIG. 15A is a plan view of the GaN LED element 1 according to the present embodiment and FIG. 15B is a cross-sectional view taken along the line J—J thereof. As shown in the drawings, the GaN LED element 1 has a double heterostructure including a GaN buffer layer 31, an n-type GaN layer 32, an InGaN active layer 33, a p-type AlGaN layer 34, and a p-type GaN layer 35 which are stacked sequentially in layers on the top face of the sapphire substrate 30. The top face of the n-type GaN layer 32 has a stepped configuration consisting of an upper-level portion occupying the major part of the top face and a lower-level portion occupying the remaining minor part thereof. An n-side electrode 6 made of Ti and Au is formed on the top face of the lower-level portion of the n-type GaN layer 32. The aforesaid InGaN active layer 33, p-type AlGaN layer 34, and p-type GaN layer 35 are stacked sequentially in layers on the top face of the upper-level portion of the n-type GaN layer 32. A p-side electrode 5 is disposed directly on the top face of the p-type GaN layer 35 with no intervention of a transparent electrode for current diffusion. The GaN LED element 1 according to the present embodiment is typically configured as a square with sides on the order of 0.28 mm in two dimensions.

Figure 16A:
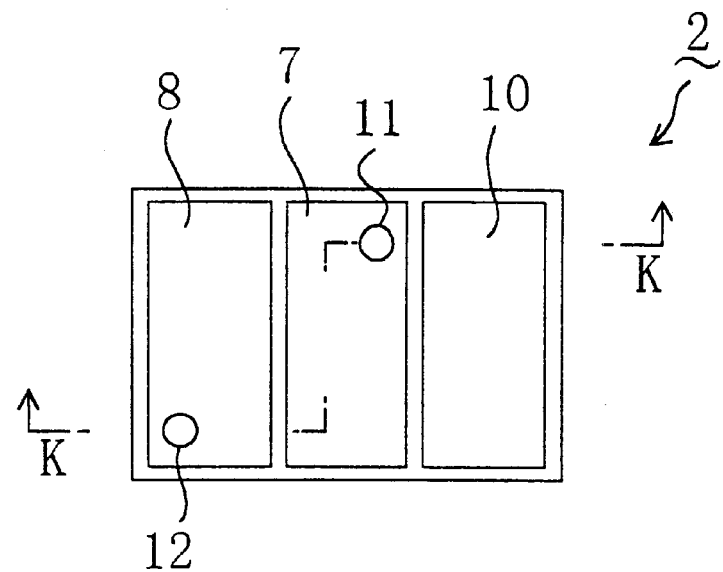
FIG. 16A is a plan view showing the structure of a Si diode element according to the ninth embodiment and FIG. 16B is a cross-sectional view taken along the line K—K thereof.
Figure 16B:
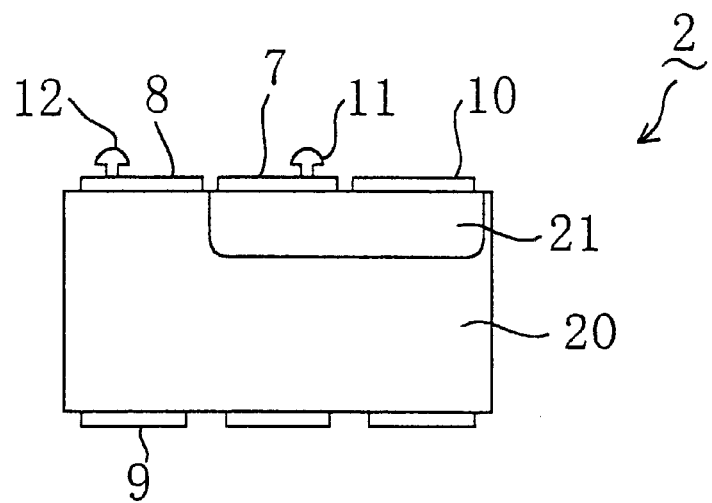

FIG. 16A is a plan view of the Si diode element 2 according to the present embodiment and FIG. 16B is a cross-sectional view taken along the line K—K thereof. As shown in FIGS. 16A and 16B, a p-type semiconductor region 21 is formed by selectively implanting impurity ions into an n-type silicon substrate 20 of the Si diode element 2. The reverse breakdown voltage for the Si diode element 2 is set at a value in the vicinity of 10 V. Thereafter, the p-side and n-side electrodes 7 and 8 of the Si diode element 2 are formed on the p-type semiconductor region 21 and on the n-type silicon substrate 20 (n-type semiconductor region), respectively. A part of the p-side electrode 7 forms the bonding pad portion 10. The n-side electrode 9 for providing an electrical connection with the leadframe is formed on the back face of the n-type silicon substrate 20. The two-dimensional size of the Si diode element 2 according to the present embodiment is on the order of 0.32×0.45 mm.

Next, the procedure for mounting the GaN LED element 1 on the Si diode element 2 will be described.

The description will be given first to the procedure for forming the Au microbumps for providing electrical connections between the electrodes of the GaN LED element 1 and the electrodes of the Si diode element 2. The microbumps 11 and 12 are formed on the p-side and n-side electrodes 7 and 8 on the top face of the Si diode element 2 by selectively plating with Au only the top faces of the electrodes 7 and 8 masked with a photoresist film patterned by a photolithography process step. Each of the microbumps 11 and 12 according to the present embodiment has a mushroom-like configuration having a diameter on the order of 30 μm and a height on the order of 10 μm.

Next, the GaN LED element is positioned above the Si diode element 2, while having the n-side and p-side electrodes 6 and 5 thereof opposed to the p-side and n-side electrodes 7 and 8 of the Si diode element 2, respectively. Then, an UV curable insulating resin 16 is interposed between the GaN LED element and the Si diode element and irradiated with UV light, while the GaN LED element 1 is pressed thereto, thereby fixing the two elements 1 and 2 to each other and providing electrical connections between the corresponding electrodes of the elements 1 and 2. By thus performing a flip-chip connecting process step in accordance with the foregoing microbump bonding method, there is formed a composite device made of the electronic device paired up with the optical device.

Subsequently, as shown in FIG. 13, the composite device is die-bonded onto the leadframe 13a with the Ag paste 14.

After that, a wire bonding process step is performed to provide a connection between the bonding pad portion 10 of the p-side electrode 7 and the leadframe 13b via the Au wire 17. However, it is also possible to perform the wire bonding process step first and then the foregoing flip-chip connecting process step.

Finally, a resin molding process step is performed by using the transparent epoxy resin 18 to provide the light-emitting device shown in FIG. 1.

Since the present embodiment has constituted the composite device by connecting the GaN LED element 1 to the Si diode element 2 in the opposite-polarity relation, as described above, the reverse voltage applied to the GaN LED element 1 can be cut off at a value in the vicinity of the forward voltage applied to the Si diode element 2, while the forward voltage applied to the GaN LED element 1 can be cut off at a value in the vicinity of the reverse break down voltage for the Si diode element 2, so that the destruction of the GaN LED element 1 due to static electricity is surely prevented.

Moreover, since the present embodiment has composed the composite device by mounting the GaN LED element 1 on the Si diode element 2 by flip-chip bonding in accordance with the microbump bonding method, a large bonding pad portion for wire bonding is no more necessary to provide a connection therebetween, which achieves the scaling down of the whole composite device and a reduction in the area of the n-side electrode 6 not contributing to light emission and a surrounding portion thereof. Specifically, the area of the n-side electrode 6 and the surrounding portion thereof occupies only 1/15 of the surface area of the GaN LED element 1 in the present embodiment. By contrast, the area of the n-side electrode 36 not contributing to light emission and the surrounding portion thereof occupies ½ of the surface area of the conventional GaN LED element 1 shown in FIG. 4A if the element is assumed to have a square cross section with 0.34 mm sides. In short, the GaN LED element 1 according to the present embodiment has an enlarged light-emitting area which is 1.26 times the light-emitting area of the conventional GaN LED element 1 shown in FIGS. 4A and 4B, though it has a reduced size which is 0.68 times the size of the conventional GaN LED element 1. By thus providing the flip-chip connection in accordance with the microbump bonding method, the area of a costly compound semiconductor substrate can be reduced, resulting in lower cost and an enhanced light-emitting ability.

Since light can be emitted from the back face of the transparent sapphire substrate in the present embodiment, there can also be achieved the advantage of improved light-emitting efficiency.

Although the p-side electrode 7 is disconnected from the bonding pad portion 10 in the present embodiment, they may be formed integrally. The present embodiment has the advantage of easily and surely preventing the UV curable insulating resin 16 from spreading to the bonding pad portion 10 with a midway groove. In the case of performing the wire bonding process step first and then the flip-chip connecting process step, however, the formation of the bonding pad portion 10 integral with the portion of the p-side electrode 7, on which the microbump 11 is formed, has the advantage over the present embodiment, since the UV curable insulating resin 16 spreading to the bonding pad portion 10 causes no trouble but has the advantage of stably maintaining the bonding pad portion 10 and the p-side electrode 7 at the same potential.

Since the p-side electrode 5 of the GaN LED element 1 is opposed to the n-side electrode 8 of the Si diode element 2 in the present embodiment, light emitted from the light-emitting layer underlying the p-side electrode 5 can be reflected upward by the n-side electrode 8, resulting in improved light-emitting efficiency.

Although the foregoing description has been given to the embodiment in which the microbumps 11 and 12 are formed on the p-side and n-side electrodes 7 and 8 of the Si diode element 2, it will easily be appreciated that the microbumps 11 and 12 may also be formed on the p-side and n-side electrodes 5 and 6 of the GaN LED element 1.

Preferably, the n-side electrode 8 on the Si diode element 2 is in maximum size and opposed to the p-side electrode 5 of the GaN LED element 1, since the light-emitting efficiency can further be improved by upwardly reflecting light leaked laterally of the GaN LED element 1.

Although the present embodiment has configured the p-side and n-side electrodes on the top face of the Si diode 2 as rectangles separated from each other in one direction, i.e., arranged in parallel with each other, the present invention is not limited to the embodiment. The p-side and n-side electrodes on the top face of the Si diode element 2 may also have triangular configurations diagonally separated from each other in two dimensions or curved configurations.

Embodiment 10

Although the ninth embodiment has mounted the GaN LED element on the Si diode element, the present embodiment provides a Si diode element made of a thin film on a GaN LED element.

Figure 17:
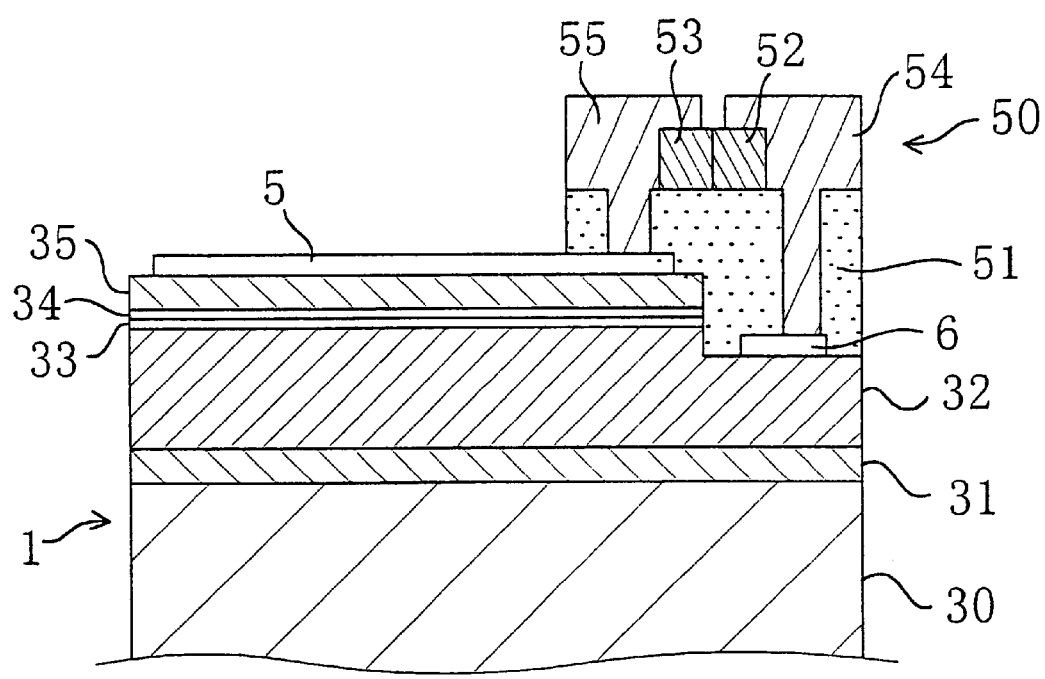
FIG. 17 is a cross-sectional view showing the respective structures of a GaN LED element and a diode element according to a tenth embodiment of the present invention.

FIG. 17 is a cross-sectional view showing only the device portion of an LED lamp according to the present embodiment. The device portion is to be mounted on leadframes and finally molded with a resin in the same configuration as shown in FIG. 1 illustrating the first embodiment, though the drawing of the device portion mounted on the leadframes will be omitted.

As shown in FIG. 17, an interlayer insulating film 51 made of a silicon oxide film is formed on the GaN LED element 1 having the same structure as in the ninth embodiment and a silicon thin film is formed thereon. In the silicon thin film, a p-type semiconductor region 52 and an n-type semiconductor region 53 are formed. The silicon thin film can be formed easily by utilizing TFT formation technology associated with a liquid-crystal device. The diode element 50 is provided with a p-side electrode 54 filling in a through hole formed in the interlayer insulating film 51 to be connected to the n-side electrode 6 of the GaN LED element 1, while being connected to the p-type semiconductor region 52 thereof. The diode element 50 is also provided with an n-side electrode 55 filling in a though hole formed in the interlayer insulating film 51 to be connected to the p-side electrode 5 of the GaN LED element 1, while being connected to the n-type semiconductor region 53 thereof. The p-side and n-side electrodes 54 and 55 of the diode element 50 are connected to leadframes by wire bonding, though the drawing thereof is omitted. In this case, light generated by the GaN LED element 1 is reflected by the leadframes and emitted upward. However, since the diode element 50 can be formed in a narrow limited region, desired light-emitting efficiency can easily be achieved.

The present embodiment also achieves the same effects as the ninth embodiment does.

Embodiment 11

An eleventh embodiment will be described. A light-emitting device according to the present embodiment has the same Si diode element as used in the ninth embodiment which is mounted on the silicon substrate without being opposed to the diode element.

Figure 18:
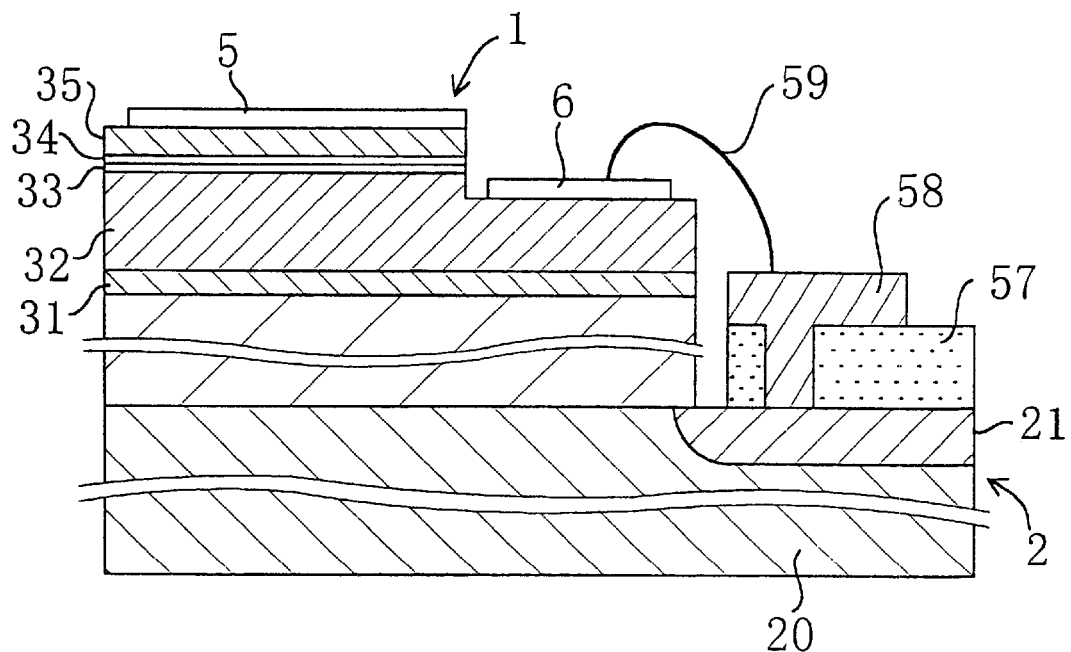
FIG. 18 is a cross-sectional view showing the respective structures of a GaN LED element and a diode element according to an eleventh embodiment.

FIG. 18 is a cross-sectional view showing the structure of only the device portion of an LED lamp according to the present embodiment. The device portion is to be mounted on leadframes and finally molded with a resin in the same configuration as shown in FIG. 13 illustrating the ninth embodiment, though the drawing of the device portion mounted on the leadframes will be omitted.

As shown in FIG. 18, the Si diode element 2 is formed in the n-type silicon substrate 20 larger in area than in the ninth embodiment. Specifically, the p-type semiconductor region 21 is formed by selectively implanting impurity ions into the n-type silicon substrate 20. After the interlayer insulating film 57 is formed, the p-side electrode 58 for contact with the p-type semiconductor region 21 is formed on the interlayer insulating film 57. The n-side electrode for contact with the n-type silicon substrate 20, i.e., with the n-type semiconductor region is also formed in a portion other than the cross section shown in FIG. 18, though the drawing thereof is omitted. It is to be noted that the reverse breakdown voltage and forward voltage for the Si diode element 2 are set to the same values as in the ninth embodiment.

On the other hand, the GaN LED element 1 having basically the same structure as in the ninth embodiment is disposed on the silicon substrate 20. However, the n-side electrode 6 of the GaN LED element 1 is formed larger in size to have a sufficient area to allow wire bonding. The n-side electrode 6 of the GaN LED element 1 is connected to the p-side electrode 58 of the Si diode element 2 via a wire 59, while the p-side electrode 5 of the GaN LED element 1 is connected to the n-side electrode of the Si diode element 2 via a wire in a portion not shown in FIG. 18. In the present embodiment, light is emitted from the GaN LED element 1 upwardly of the p-side electrode 6.

Connections between the individual semiconductor regions of the diode element 2 and the individual electrodes of the GaN LED element 1 may also be achieved by forming a multilayer wiring structure as formed in the tenth embodiment.

Although the effects of minimizing the whole light-emitting device and improving the light-emitting efficiency achieved by the present embodiment are inferior to those achieved by the ninth embodiment, there can be implemented a light-emitting device capable of exerting voltage resistance to static electricity or the like, similarly to the ninth embodiment, in accordance with the method not using microbumps.

Embodiment 12

A twelfth embodiment will be described. The present embodiment forms a GaN LED element and a diode element on a single common insulating substrate.

Figure 19:
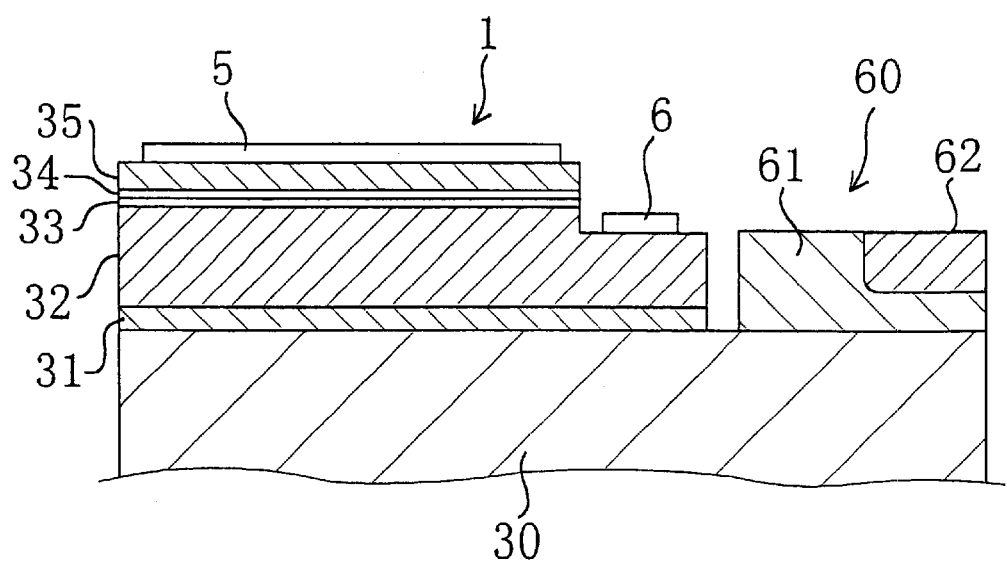
FIG. 19 is a cross-sectional view showing the respective structures of a GaN LED element and a diode element according to a twelfth embodiment of the present invention.

FIG. 19 is a cross-sectional view showing the structure of only the device portion of an LED lamp according to the present embodiment. The device portion is to be mounted on leadframes and finally molded with a resin in the same configuration as shown in FIG. 13 illustrating the ninth embodiment, though the drawing of the device portion mounted on the leadframes will be omitted.

As shown in FIG. 19, the GaN LED element 1 having the same structure as in the ninth embodiment is formed on a sapphire substrate 30. A diode 60 including a p-type semiconductor region 61 and an n-type semiconductor region 62 each formed in a silicon thin film is further formed on the sapphire substrate 30 laterally of the GaN LED element 1. The silicon thin film on the sapphire substrate 30 can be formed easily by utilizing, e.g., TFT formation technology associated with a liquid-crystal device. A connection between the p-type semiconductor region 61 of the diode element 60 and the GaN LED element 1 may also be achieved by forming a multilayer wiring structure as formed in the tenth embodiment or by wire bonding as performed in the eleventh embodiment.

Because the sapphire substrate 30 is high in melting point, the present embodiment has the advantage of forming a silicon single-crystal thin film extremely easily by a laser recrystallization method after the deposition of a polysilicon film. Moreover, since the present embodiment can easily be constituted such that light is emitted from the underlying sapphire substrate, it is possible to maintain high light-emitting efficiency even when the GaN LED element 1 is connected to the diode element 60 by wire bonding.

Variations of Embodiments 9 to 12

The foregoing embodiments can be modified to provide the following variations.

The structure according to the ninth embodiment may be modified such that the surface of the n-side electrode 8 of the Si diode 2 is entirely opposed to the surface of the p-side electrode 5 of the GaN LED element 1 in planar symmetrical configuration. In that case, the light-emitting efficiency can further be improved by upwardly reflecting light emitted downward from the p-side electrode 5 of the GaN LED element 1 with the n-side electrode 8 of the Si diode element 2.

The twelfth embodiment may be modified such that the sapphire substrate is used as one of transparent substrates holding a liquid crystal of a liquid-crystal device and that light emitted from the GaN LED element is emitted from the back face of the sapphire substrate to be used as one of the back lights of the liquid-crystal device. In that case, an electrostatic protection element may be operated in synchronization with the TFT. The arrangement provides a highly reliable light-emitting device to be used as the back light of the liquid-crystal device. It is also possible to use, as one of liquid-crystal holder plates, a structure including a light-emitting element and a diode made of a silicon thin film each mounted on a glass substrate made of a crystal glass or the like.

Although each of the foregoing embodiments has formed the landscape pn diode as the electrostatic protection element, the present invention is not limited thereto. Instead, various diodes including a portrait pn diode, a pin diode, a Schottky barrier diode, a Zener diode, a tunnel diode, or a Gunn diode may be used as the electrostatic protection element. It is also possible to form a Gunn diode utilizing the Gunn effect of a compound semiconductor on the substrate of the light-emitting element.

As the electrostatic protection element, a field-effect transistor having a threshold voltage adjusted to be higher than an operating voltage for the light-emitting element and lower than the forward and reverse breakdown voltages therefor may also be provided.

Although each of the foregoing embodiments has described the light-emitting device comprising the GaN LED element as the light-emitting element, the present invention is not limited thereto. Instead, the light-emitting device may also comprise a GaN-based laser diode element or a light-emitting element mounted on an insulating substrate containing a material other than GaN as the main component.

In the conventional configuration shown in FIG. 5, the electrostatic protection element may be disposed laterally of the GaN LED element on the die pad so that a wire is used to provide a connection between the two elements. In that case, the electrostatic protection element may be constituted by a diode formed on a silicon substrate as in the first embodiment or by a diode made of a silicon thin film formed on a die pad with an insulating film interposed therebetween.

Method of Manufacturing Semiconductor Light-Emitting Device

Figure 20:
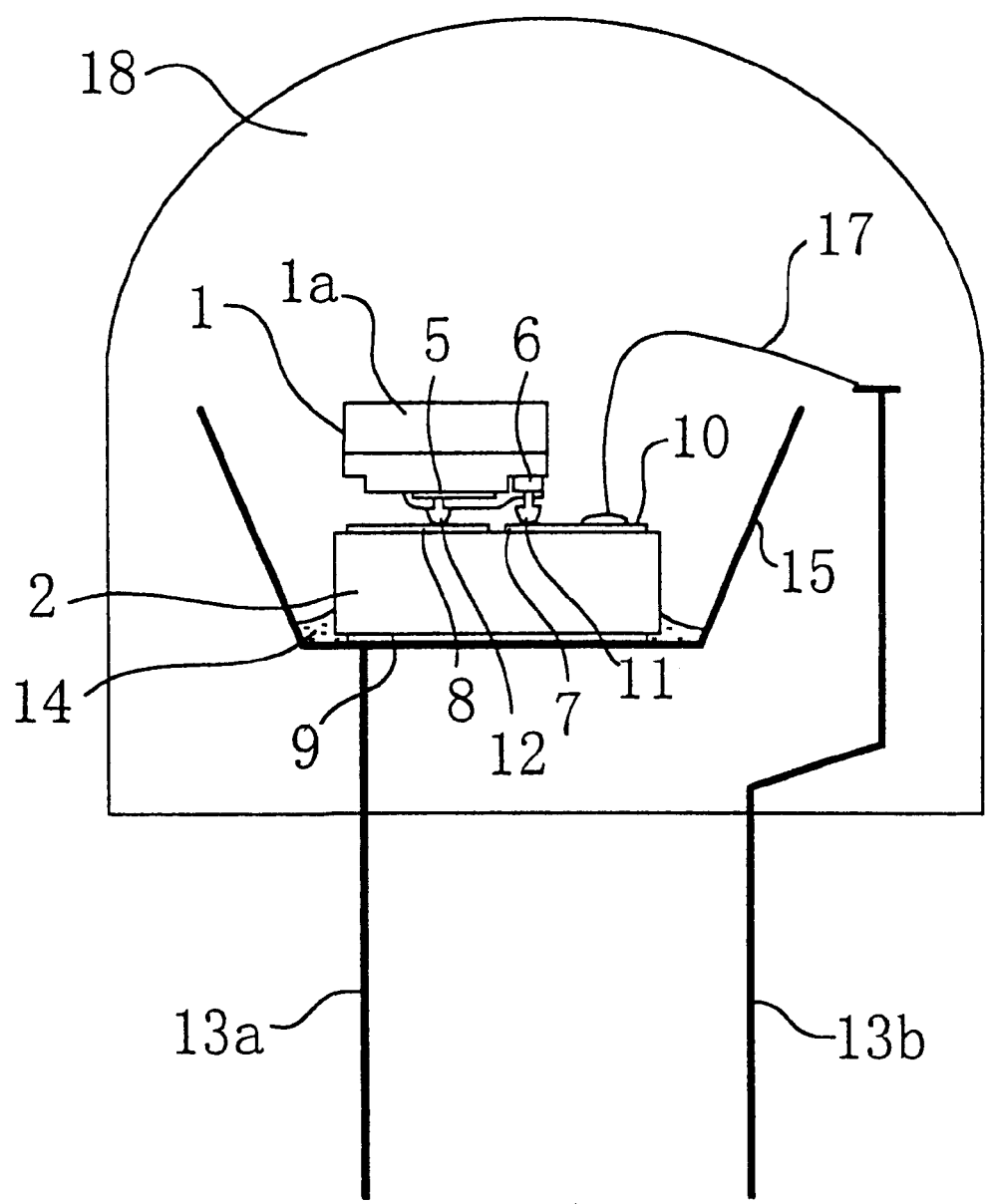
FIG. 20 is a cross-sectional view of a semiconductor light-emitting device according to another embodiment of the present invention.

FIG. 20 schematically shows an exemplary semiconductor light-emitting device comprising a flip-chip light-emitting element produced in accordance with the manufacturing method according to the present invention. Although the light-emitting device shown in FIG. 20 is similar to the device shown in FIG. 13, a submount element 2 need not necessarily have the function of protecting against static electricity in the following embodiments. It will easily be appreciated that, in the case where the circuit shown in FIG. 2 is configured by using a Si diode element as the submount element 2, the submount element 2 can serve as the electrostatic protection element having a protecting function from a high voltage such as static electricity, as stated previously. In the case where the submount element 2 functions to facilitate connections between the leadframes 13a and 13b and the light-emitting element 2 in FIG. 20, however, the submount element 2 need not necessarily have the structure as a diode.

In the light-emitting device of FIG. 20, the submount element 2 and the LED element 1 are mounted in overlapping relation on the mount portion 15 of the leadframe 13a. The LED element 1 is disposed in a face-down configuration in which the back face of the transparent substrate 1a faces upward, while the p-side and n-side electrodes 5 and 6 formed on the p-type and n-type semiconductor regions of the LED element 1, respectively, face downward. The back face of the transparent substrate 1a functions as the light emitting face. Light emitted from the element 1 is radiated from the back face of the transparent substrate 1a with high efficiency.

A backside electrode 9 is formed on the back face of the submount element 2 and electrically connected to the mount portion 15 via the conductive paste 14. The electrodes 7 and 8 are formed on the top face of the submount element 2 and opposed to the n-side and p-side electrodes 6 and 5 of the semiconductor light-emitting element 1, respectively. The n-side and p-side electrodes 6 and 5 and the electrodes 7 and 8 of the submount element 2 opposed thereto are connected to each other via the microbumps 11 and 12.

The bonding pad portion 10 is formed on the surface of the electrode 7 of the submount element 2 and connected to the leadframe 13b via the wire 17. These elements 1 and 2 are molded with the transparent resin 18.

In the method of manufacturing the semiconductor light-emitting device according to the present invention, the formation of the microbumps on the electrodes of the semiconductor light-emitting element or of the submount element is followed by electrical/physical connection of the semiconductor light-emitting element to the submount element via the microbumps. When the corresponding electrodes of the two elements are opposed to and brought into contact with each other, a gap corresponding in height to the microbumps is formed between the two elements. The gap prevents the two elements from being brought into contact with each other at any portion other than the microbumps, eliminates a short-circuit failure in the conductive state, and provides a manufacturing method with excellent production yield. In bonding the corresponding electrodes of the two elements to each other via the microbumps, however, the microbumps are destroyed to some extent depending on the connecting method, resulting in the gap reduced in height between the two elements. In consideration of this, each of the microbumps is preferably formed to have a larger height. The microbump preferably has a height on the order of 20 to 50 µm.

The material of the microbumps may be a solder material or an Au-based material. Although either of the solder material and the Au-based material may be used as the material of the microbumps according to the present invention, the Au-based material is preferable to the solder material. This is because the Au-based material has advantages over the solder material, some of which are: (1) a reduction in the area of the electrodes on which the microbumps are formed; (2) an easier method of forming the microbumps; and (3) comparatively easy bonding of the two elements via the microbumps.

The Au microbumps may be formed by a stud bump method or a plating method. In accordance with the stud bump method, the tip of an Au wire inserted through a capillary is formed into a ball, which is pressed against the electrode and destroyed with the application of an ultrasonic wave and heat to be welded onto the electrode. The Au wire is then pulled to disconnect the main portion of the Au wire, whereby the microbump is formed. In this case, the electrodes of the semiconductor light-emitting element or submount element are preferably formed of Au or Al. The electrodes formed of Au or Al has the advantage of avoiding the necessity for adopting a special electrode structure so that they can be formed only on excellent elements after the process step of testing elements.

In accordance with the stud bump method, however, the electrode should have a diameter of about 100 µm or more even when an Au wire with a diameter of 30 µm or more is used.

In accordance with the plating method, the element formation process step requires an additional plating process step. By way of example, a detailed description will be given to the case of forming microbumps on a semiconductor light-emitting element by the plating method. Specifically, a semiconductor multilayer film is deposited on the substrate (sapphire wafer) of the semiconductor light-emitting element, in which p-type and n-type semiconductor regions are formed. Next, an n-side electrode is formed by sequentially stacking a Ti layer and an Au layer on a part of the n-type semiconductor region. Thereafter, a Ni layer and an Au layer are deposited sequentially over the entire surface of the wafer. Subsequently, a resist film with openings corresponding to a region overlying a part of the n-side electrode and to a region overlying a part of the p-type semiconductor region is formed by a photolithography process step. The openings are then plated with the Au-based material, resulting in the microbumps each having a height on the order of 15 to 30 µm. After the resist is removed, the Ni and Au layers are etched away except for the portions corresponding to the n-side electrode and the p-type semiconductor region with the microbumps formed thereon. As a result, the semiconductor light-emitting element, on which the microbumps are formed, is completed.

In the case of forming the microbumps on the submount element by the plating method, the microbumps can be formed by the same process step as described above if the electrodes of the submount element are formed of the Au-based material. If the electrodes are formed of Al, however, it is necessary to form a barrier metal layer on the Al electrode in accordance with the same method as used in forming the microbumps on the Al electrodes of an integrated circuit element.

Although such a plating method is disadvantageous in that it requires a larger number of element manufacturing steps and an improved method of testing elements, it also has the advantage of minimizing the electrode area necessary for forming the microbumps. For example, an electrode having a diameter on the order of 60 µm satisfactorily carries a microbump having a diameter of 30 µm and a height of 20 µm formed thereon, resulting in a reduced element size and lower cost. Since the alignment accuracy in forming the microbumps is determined by the alignment accuracy in the photolithographic step, the alignment accuracy in forming the microbumps is much higher than the alignment accuracy in forming the stud bumps.

Various methods including the following four may be used to bond the submount elements to the LED element via the microbumps.

First Connecting Method: Au—Au or Au—Al Bonding Method

In the first method, Au microbumps formed on the electrodes are welded to the opposed electrodes with the application of heat, ultrasonic waves and load.

Second Connecting Method: Stud Bump Bonding (SBB) Method

In the second method, a conductive paste is transferred onto the microbumps and brought into contact with the opposed electrodes to be solidified. Thereafter, a mold resin is filled and solidified. The second method is highly reliable under external stress. In addition, stress is less likely to develop during mounting. Since a test can be performed prior to molding, repairs can be performed easily.

Third Connecting Method: ACF Method

In the third method, connections are achieved by using an anisotropic conductive sheet or adhesive. The third method has the advantage of a comparatively small number of process steps.

Fourth Connecting Method: Solder Bonding Method

In the fourth method, counter bumps are formed by soldering on the electrodes opposed to the microbumps and the solder is caused to reflow for bonding. A mold resin is filled and solidified. The fourth method has the advantage of enhanced connecting strength after reflow.

The foregoing second to fourth connecting methods are suitable for surface-mounting an integrated circuit element with a large number of microbumps arranged in high density on a circuit board. However, these connecting methods are long in a tactic for completing bonding and comparatively low in productivity. By contrast, the first connecting method in which microbumps are crushed with the application of heat, ultrasonic waves and load is unsuitable for mounting an integrated circuit element with bumps arranged in high density but appropriate when two or three microbumps are present at intervals of 100 µm or more on the electrodes of the LED element as in the present invention. In addition, the time required to implement the first connecting method is as short as 0.5 seconds, which is excellent in terms of productivity in mounting the LED element or the like. If attention is not focused on productivity, the second to fourth methods may be used.

Referring now to the accompanying drawings, the method of manufacturing the semiconductor light-emitting device according to the present invention will be described in greater detail.

Embodiment 13

With reference to the flow chart of FIG. 21, an embodiment of the method of manufacturing the device shown in FIG. 20 will be described.

Figure 31A:
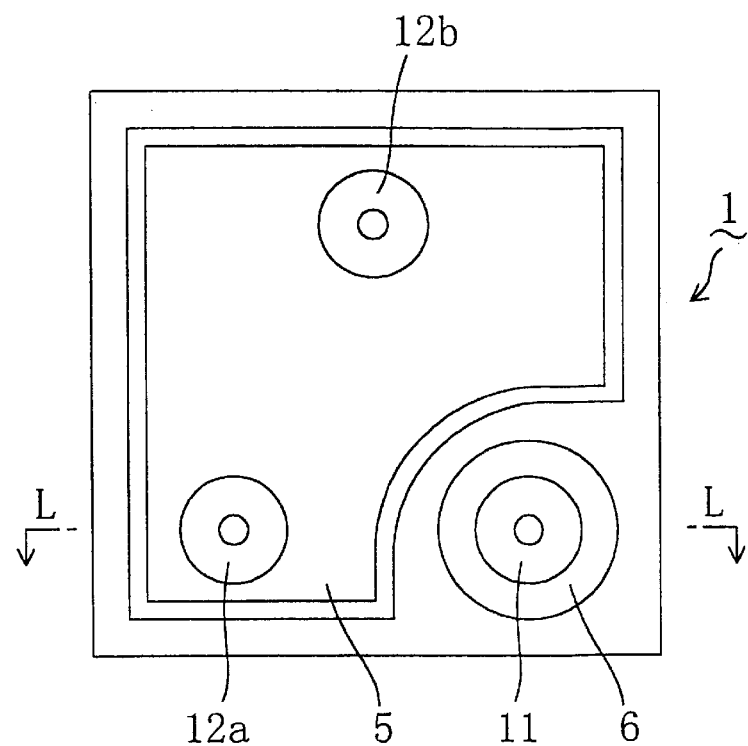
FIG. 31A is a plan view of an LED element used in the thirteenth embodiment and FIG. 31B is a cross-sectional view taken along the line L—L thereof.
Figure 31B:
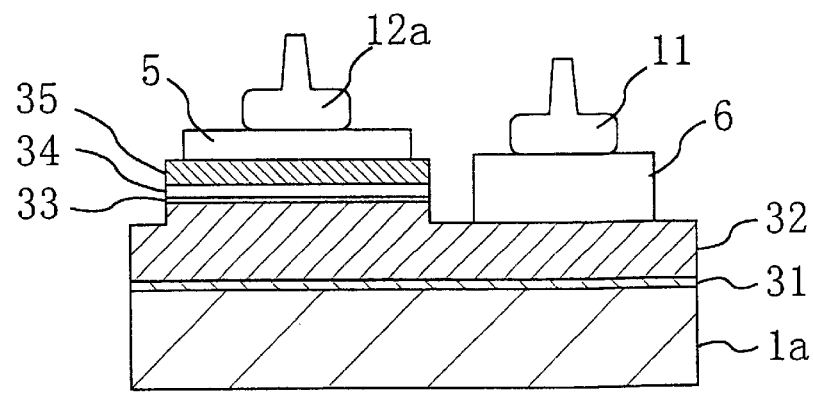

First, the process step of manufacturing an LED element is performed. In Step S1, an LED expand process step is performed, which is the process step of dividing the wafer into individual chips at the final stage of a wafer-level manufacturing process to provide the LED elements 1. In the present embodiment, the LED element 1 shown in FIGS. 31A and 31B is used as a semiconductor light-emitting element. The LED element 1 is manufactured by the following exemplary process.

First, the GaN buffer layer 31, the n-type GaN layer 32, the In GaN active layer 33, the p-type AlGaN layer 34, and the p-type GaN layer 35 are stacked in this order on a sapphire substrate 1a, resulting in a semiconductor multilayer structure including a double heterostructure formed on the sapphire substrate 1a.

The resulting semiconductor multilayer structure is partially etched from the top face thereof to an inner portion of the n-type GaN layer 32 to provide a structure having a configuration as shown in FIGS. 31A and 31B. By the etching process step, the top face of the n-type GaN layer 32 is processed into the stepped configuration consisting of the lower-level portion and the upper-level portion. The InGaN active layer 33, the p-type AlGaN layer 34, and the p-type GaN layer 35 remain non-etched on the top face of the upper-level portion of the n-type GaN layer 32.

After the etching process step, the p-side electrode 5 made of Ni and Au is formed on the top face of the p-type GaN layer 35 and the n-side electrode 6, made of Ti and Au, is formed on the lower-level portion of the top face of the n-type GaN layer 32. Thereafter, the stud bump 11 is formed on the n-side electrode 6, while the stud bumps 12a and 12b are formed on the p-side electrode 5. The formation of the stud bumps 11, 12a, and 12b is performed by the stud bump method described above.

Each of the foregoing process steps is performed by using the sapphire substrate 1a in the form of a wafer, on which a plurality of LED elements 1 are formed simultaneously. As a result, such a plurality of LED elements 1 as shown in the drawing are formed on the sapphire substrate 1a in the form of a wafer.

In the present embodiment, the plurality of LED elements 1 formed on the sapphire substrate 1a in the form of a wafer are tested prior to the formation of the stud bumps. If any defective LED element 1 is found as a result of testing, no stud bump is formed on the defective LED element 1. After the stud bumps are formed only on excellent elements, the sapphire substrate 1a is opposed to a sheet with the microbumps of the LED elements 1 facing downward and the LED elements 1 on the sapphire substrate 1a are attached to the sheet. Subsequently, the sapphire substrate 1a is scribed and broken. After that, the sheet is expanded in the lateral direction, whereby the individual LED elements 1 are separated in the lateral direction (LED expand process step).

Figure 21:
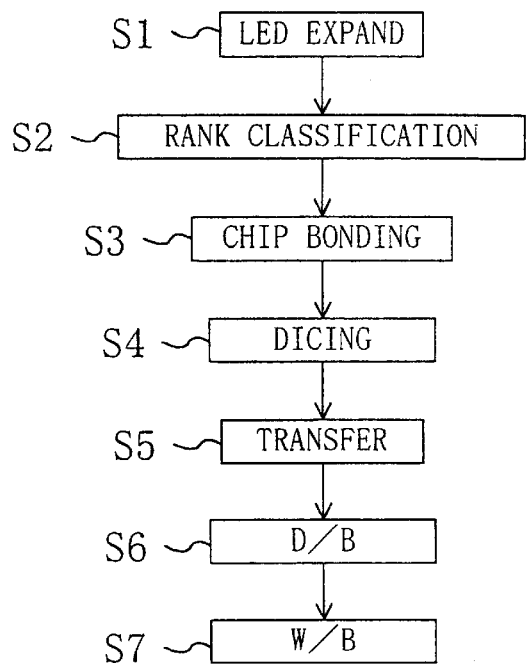
FIG. 21 is a flow chart illustrating a manufacturing method according to a thirteenth embodiment of the present invention.
Figure 27:
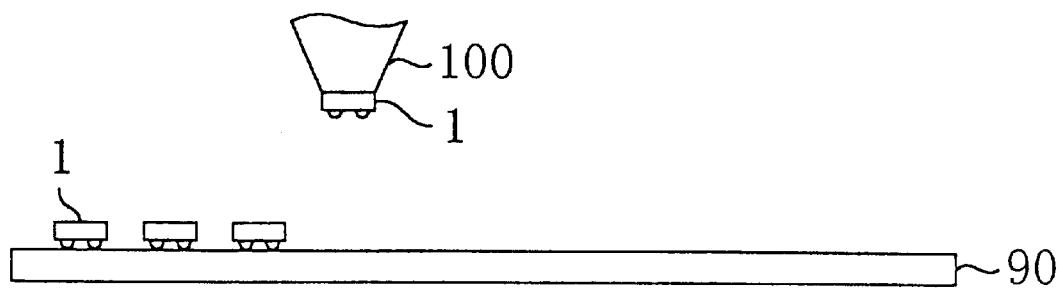
FIG. 27 is a cross-sectional view diagrammatically showing the relations among a wafer, an LED element, and a jig for conveying the LED element in a chip bonding process step.

Next, after the LED elements 1 are classified by brightness rank and waveform rank in a rank classification process step performed in Step S2 shown in FIG. 21, a chip bonding process step is performed in Step S3. Specifically, a wafer (silicon wafer), in which a plurality of Si diode elements 2 are arranged in rows and columns, is prepared and each of the LED elements 1 is aligned with the corresponding Si diode element 2 in the wafer. FIG. 27 diagrammatically shows the relations among the silicon wafer 90, the LED elements 1, and the jig 100 for conveying the LED elements 1 in the chip bonding process step.

The chip bonding process step will be described in greater detail. Each of the LED elements 1 is initially brought closer to a wafer 90 including the Si diode elements 2 with the face of the LED elements 1, on which the microbumps are formed, facing downward. Thereafter, the microbumps 11, 12a, and 12b of the LED element 1 are aligned with the electrodes 7 and 8 (not shown in FIG. 27) of the corresponding Si diode element 2 and brought into contact into the electrodes 7 and 8, while heat, ultrasonic waves and load are applied to the microbumps, in accordance with the first connecting method. By thus welding the microbumps to the electrodes 7 and 8, the LED element 1 is bonded to the Si diode 2 via the microbumps. By the bonding process step, the LED element 1 is electrically/physically secured to the Si diode element 2 (chip bonding process step). Since the tactic for chip boning is short, the recognition, conveyance, alignment, and bonding of the LED element can be performed in approximately 3 seconds or less. The alignment accuracy is 15 $\mu$m or less. By the chip bonding process step, a gap of 20 $\mu$m is formed between the LED element 1 and the Si diode element 2, while a short-circuit failure seldom occurs.

Figure 28:
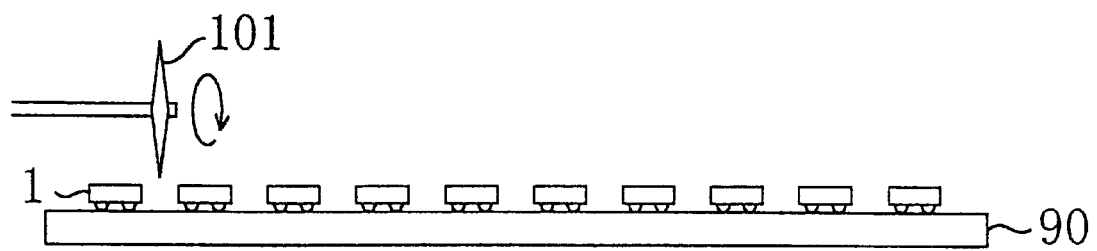
FIG. 28 is a cross-sectional view diagrammatically showing the relation between the wafer and a capillary 102 in the process step of stud bump formation.

Then, in a dicing process step performed in Step S4, the wafer in which the Si diode elements are integrated with the corresponding LED elements 1 is attached to a sheet and the resulting integrated structures are divided from the wafer into individual chips. FIG. 28 diagrammatically shows the relation between the wafer 90 and a dicing blade 101 in the dicing process step.

Each of the integrated structures is transferred to a tray in a transfer process step performed in Step S5 of FIG. 21 and then disposed on the mount portion 15 of the leadframe 13a and secured thereto in a die bonding process step (D/B process step) performed in Step S6. At this stage, the backside electrode 9 of the Si diode element 2 is opposed to the mount portion 15 via the conductive paste 14, with which the backside electrode 9 of the Si diode element 2 is electrically/physically connected to the mount portion 15.

In a wire bonding process step (W/B process step) performed in Step S7, the bonding pad portion 10 of the Si diode element 2 is connected to the other leadframe 13b via the wire 17. The components on the upper end portion of the leadframe are then molded with the transparent resin 18 to provide the semiconductor light-emitting device shown in FIG. 20.

Thus, in the present embodiment, the microbumps are formed by the stud bump method on the electrodes of the LED elements and the LED elements formed into individual chips are bonded to the Si diode elements in the form of a wafer.

Embodiment 14

Referring to the flow chart of FIG. 22, another embodiment of the manufacturing method according to the present invention will be described. The present embodiment is characterized in that the microbumps are formed by the stud bump method on the electrodes of the LED elements and that chip bonding between each of the LED elements and the corresponding Si diode element is performed on the mount portion of the leadframe by the foregoing first connecting method.

Figure 22:
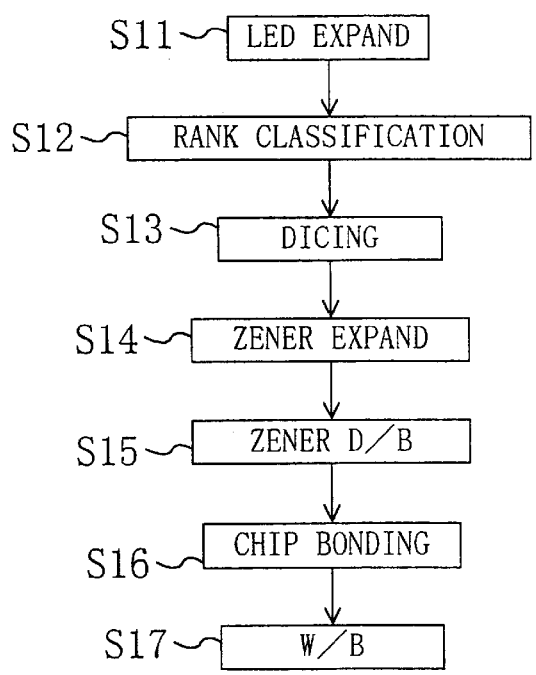
FIG. 22 is a flow chart illustrating a manufacturing method according to a fourteenth embodiment of the present invention.

First, an LED expand process step is performed in Step S11 of FIG. 22. Then, the LED elements 1 are classified by brightness rank and wavelength rank in a rank classification process step performed in Step S12.

Next, a wafer including the Si diodes 2 is attached to a sheet with the backside electrodes 9 of the wafer opposed to the sheet. After the wafer is subjected to dicing in Step S13 and then divided into individual chips in Step S14, the sheet is expanded in the lateral direction (Zener expand process step).

In Step S15, each of the Si diode elements 2 is disposed on the mount portion 15 of the leadframe 13a and secured thereto (see FIG. 20). At this stage, the backside electrode 9 of the Si diode element 2 is opposed to the mount portion 15 via the conductive paste 14, whereby the backside electrode 9 of the Si diode element 2 is electrically/physically connected to the mount portion 15 (Zener D/B process step).

Figure 29:
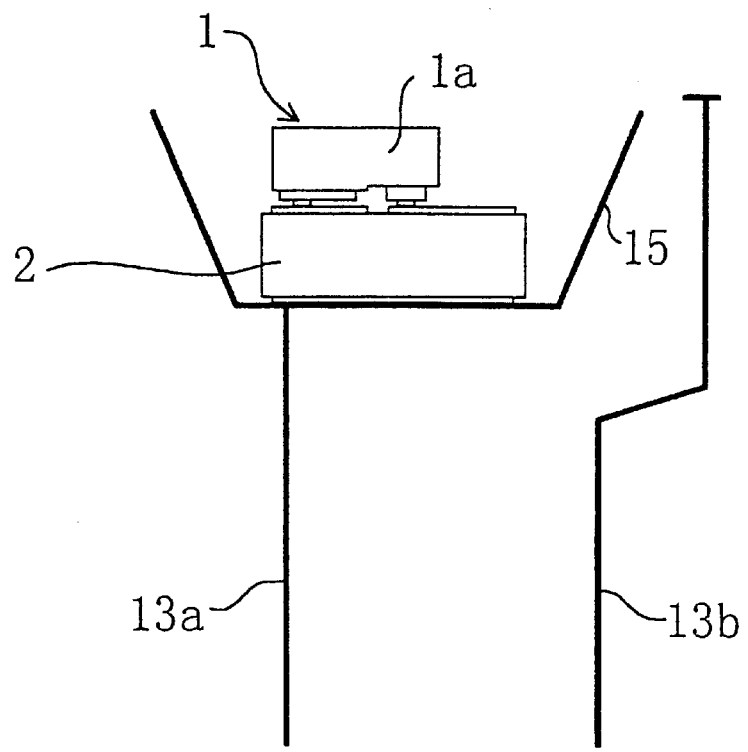
FIG. 29 is a cross-sectional view showing the LED element aligned with a Si diode element on a mount portion in the chip bonding process step.

In a chip bonding process step performed in Step S16, each of the LED elements 1 is aligned with the corresponding Si diode element 2 on the mount portion 16. More specifically, the LED element 1 is brought closer to the Si diode element 2 with the surface of the LED element 1, on which the microbumps are formed, facing downward. Thereafter, the microbumps 11 and 12 of the LED element 1 are aligned with the electrodes 7 and 8 of the Si diode element 2 and brought into contact therewith, while heat, ultrasonic waves and load are applied to the microbumps. By thus welding the microbumps to the electrodes 7 and 8, the LED element 1 is bonded onto the Si diode element 2 via the microbumps. By the bonding process step, the LED element 1 is electrically/physically fixed to the Si diode element 2 via the microbumps. FIG. 29 shows the LED element 1 and the Si diode element 2 at this stage.

Next, in a wire bonding process step (W/B process step) performed in Step S7, the bonding pad portion 10 of the Si diode element 2 is connected to the other leadframe 13b via the wire 7, resulting in the semiconductor light-emitting device shown in FIG. 20.

Embodiment 15

Referring to the flow chart of FIG. 23, still another embodiment of the manufacturing method according to the present invention will be described. The present embodiment is characterized in that the microbumps are formed by the stud bump method on the electrodes of the Si diode elements in the form of a wafer and that chip bonding between the LED elements formed into individual chips and the Si diodes in the form of a wafer is performed by the first bonding method.

First, an LED expand process step is performed in Step S21. Then, the LED elements 1 are classified by brightness rank and wavelength rank in a rank classification process step performed in Step S22.

Figure 30:
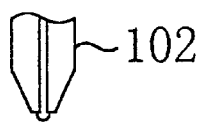
FIG. 30 is a cross-sectional view diagrammatically showing the relation between a wafer 90 and the capillary 102 in the process step of stud bump formation.
Figure 30:
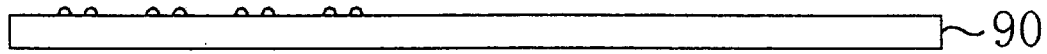
Figure 33A:
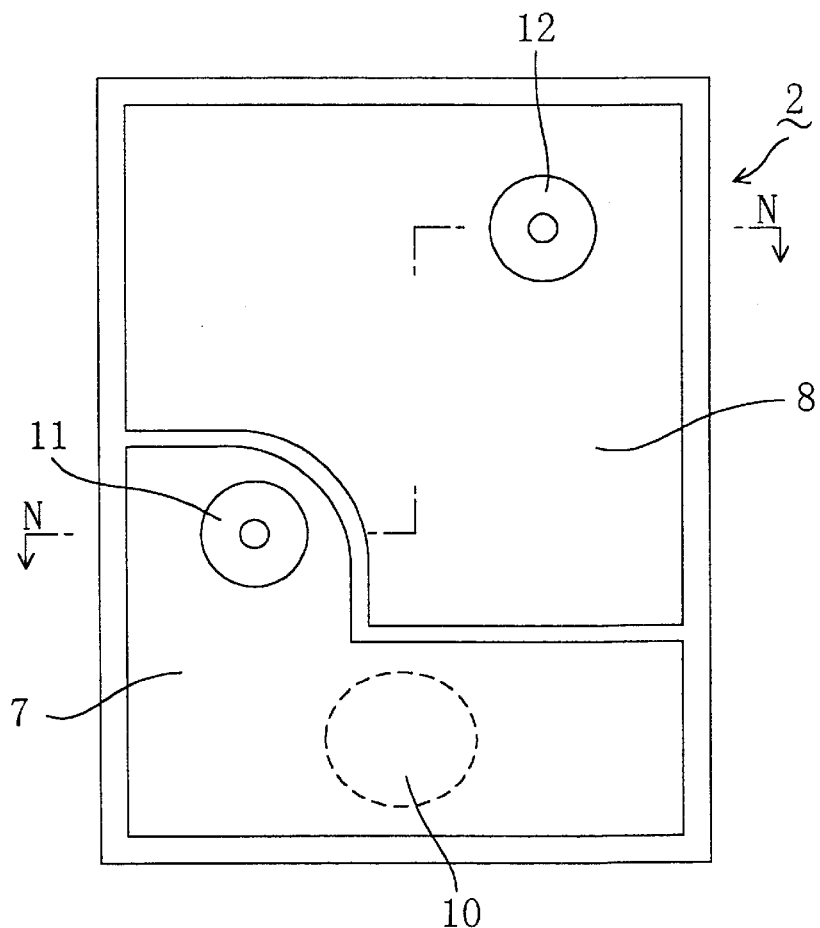
FIG. 33A is a plan view of a Si diode element, on which stud bumps are formed.
Figure 33B:
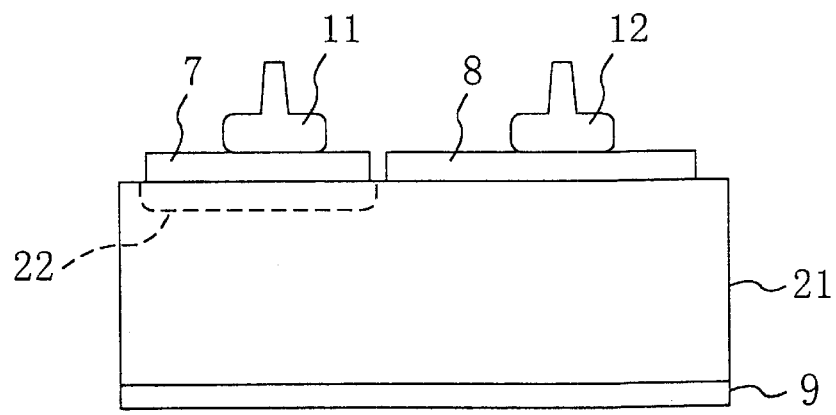
FIG. 33B is a cross-sectional view taken along the line N—N thereof.

Next, in a stud bump formation process step performed in Step S23, stud bumps 11 and 12 are formed on the p-side and n-side electrodes 7 and 8 of the individual Si diode elements 22 included in the wafer. FIG. 30 diagrammatically shows the relation between the wafer 90 and a capillary 102 in the process step of stud bump formation. FIG. 33A is a plan view of the Si diode element 2, on which the stud bumps are formed, and FIG. 33B is a cross-sectional view thereof. The Si diode element 2 has a p-type semiconductor region 22 formed by selectively implanting impurity ions into the n-type silicon substrate 21 and a reverse breakdown voltage is set at a value of about 10 V. The p-side and n-side electrodes 7 and 8 each made of Al are formed on the p-type semiconductor region 22 formed in the top face of the Si diode element 2 and on the n-type silicon substrate (n-type semiconductor region) 21, respectively. The stud bumps 11 and 12 are formed on the p-side and n-side electrodes 7 and 8, respectively. A part of the p-side electrode 7 functions as the bonding pad portion 10. The backside electrode 9 made of Au is formed on the back face of the Si diode element 2.

Figure 23:
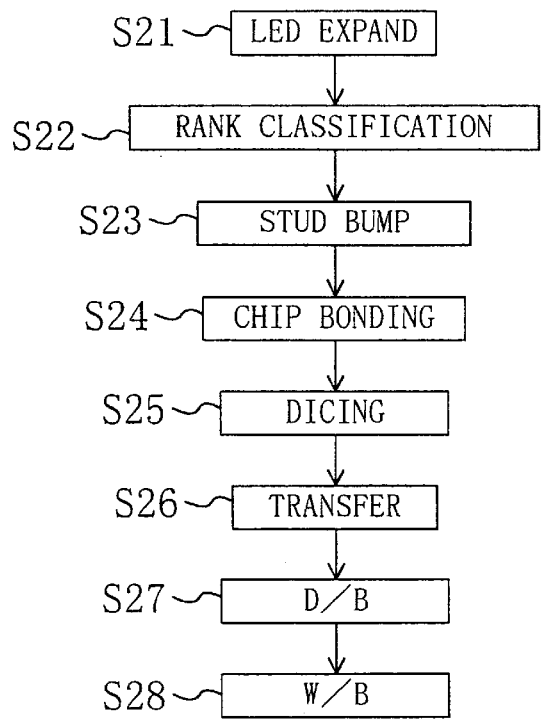
FIG. 23 is a flow chart illustrating a manufacturing method according to a fifteenth embodiment of the present invention.

Next, a chip bonding process step is performed in Step S24 shown in FIG. 23. Specifically, each of the LED elements 1 classified by rank is aligned with the corresponding Si diode element 2 in the wafer. More specifically, each of the LED elements 1 is brought closer to the wafer 90 including the Si diode elements 2 (see FIG. 30) with the surface of the LED element 1, on which the electrodes are formed, facing downward. Thereafter, the electrodes of the LED element 1 are aligned with the electrodes 7 and 8 of the corresponding Si diode element 2 and brought into contact with the microbumps 11 and 12 on the Si diode element 2, while heat, ultrasonic waves and load are applied to the microbumps. By thus welding the microbumps 11 and 12 to the electrodes, the LED element 1 is bonded to the Si diode element 2 via the microbumps. By the bonding process step, the LED element 1 is electrically/physically connected to the Si diode element 2 via the microbumps (chip bonding process step).

Then, Steps S25 to S28 are performed in the same manner as described in the thirteenth embodiment.

Embodiment 16

Figure 24:
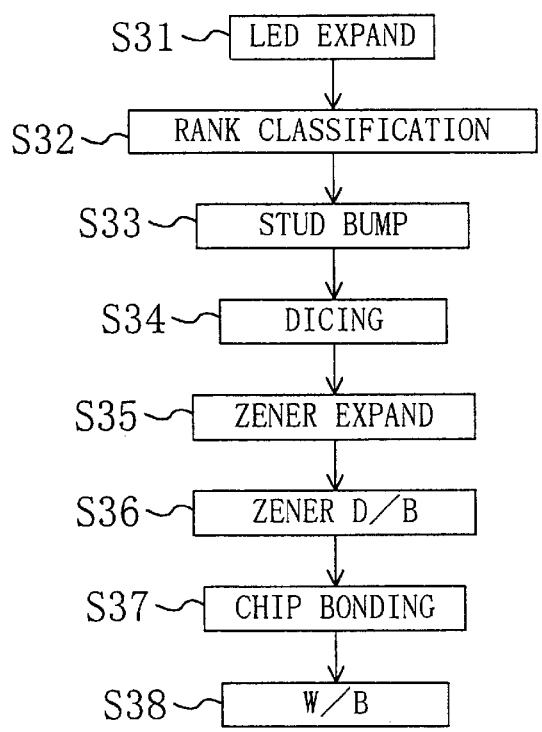
FIG. 24 is a flow chart illustrating a manufacturing method according to a sixteenth embodiment of the present invention.

Referring to the flow chart of FIG. 24, still another embodiment of the manufacturing method according to the present invention will be described. The present embodiment is characterized in that the microbumps are formed by the stud bump method on the electrodes of the Si diode elements in the form of a wafer and that chip bonding between each of the LED elements formed into individual chips and the corresponding Si diode element is performed on the mount portion of the leadframe by using the first bonding method.

First, an LED expand process step is performed in Step S31. Then, the LED elements 1 are classified by brightness rank and wavelength rank in a rank classification process step performed in Step S32.

Next, the stud bumps 11 and 12 are formed on the p-side and n-side electrodes 7 and 8 of the individual Si diode elements 2 included in the wafer (see FIG. 30).

Next, the wafer is attached to a sheet with the backside electrodes 9 of the wafer including the Si diode elements 2 opposed to the sheet. After the wafer is subjected to dicing in Step S34, the wafer is divided into the individual chips in Step S35 and the sheet is expanded in the lateral direction (Zener expand process step).

In Step S36, each of the Si diode elements 2 is disposed on the mount portion 15 of the leadframe 13a and secured thereto. At this stage, the backside electrode 9 of the Si diode element 2 is opposed to the mount portion 15 via the conductive paste, with which the Si diode element 2 is electrically/physically connected to the mount portion 15 (Zener D/B process step).

In a chip bonding process step performed in Step S37, each of the LED elements 1 is aligned with the corresponding Si diode element 2 on the mount portion 15. More specifically, the LED element 1 is brought closer to the Si diode element 2 with the surface of the LED element 1, on which the electrodes are formed, facing downward. Thereafter, the electrodes of the LED element 1 are aligned with the electrodes 7 and 8 of the Si diode element 2 and brought into contact with the microbumps 11 and 12, while heat, an ultrasonic wave, and a load are applied to the microbumps. By thus welding the microbumps to the electrodes, the LED element 1 is bonded onto the Si diode element 2 via the microbumps. By the bonding process step, the LED element 1 is electrically/physically secured to the Si diode element 2 via the microbumps.

In a wire bonding process step (W/B process step) as Step S37, the bonding pad portion 10 of the Si diode element 2 is connected to the other lead frame 13b with a wire 17, resulting in the semiconductor light-emitting device shown in FIG. 20.

Embodiment 17

In contrast to the thirteenth embodiment (FIG. 21) in which the microbumps are formed on the electrodes of the LED element by the stud bump method, the microbumps are formed on the electrodes of the LED element by an "Au plating method" in this embodiment. Since the present embodiment is the same as the thirteenth embodiment in the other respects, the detailed description thereof will be omitted.

Figure 32A:
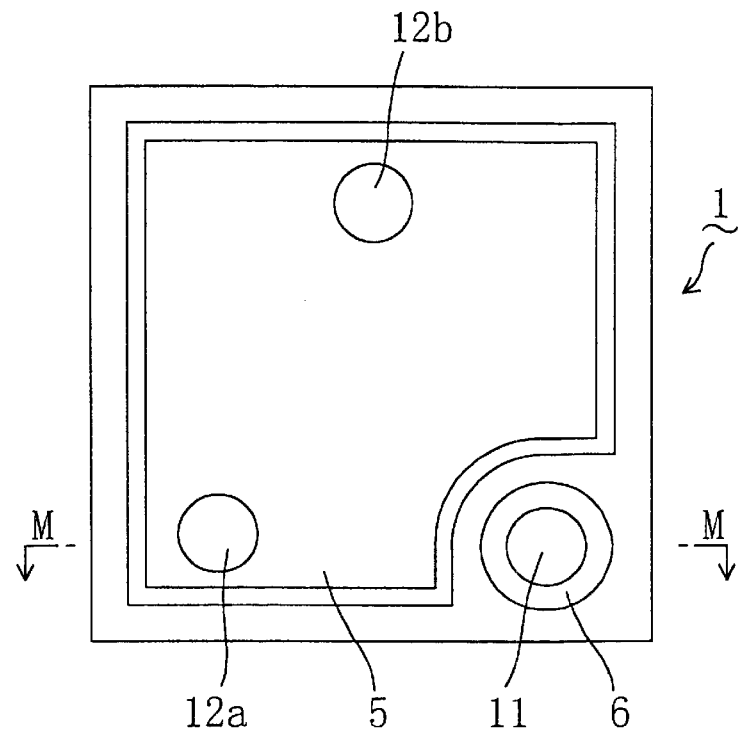
FIG. 32A is a plan view of an LED element with microbumps formed by a plating method and FIG. 32B is a cross-sectional view taken along the line M—M thereof.
Figure 32B:
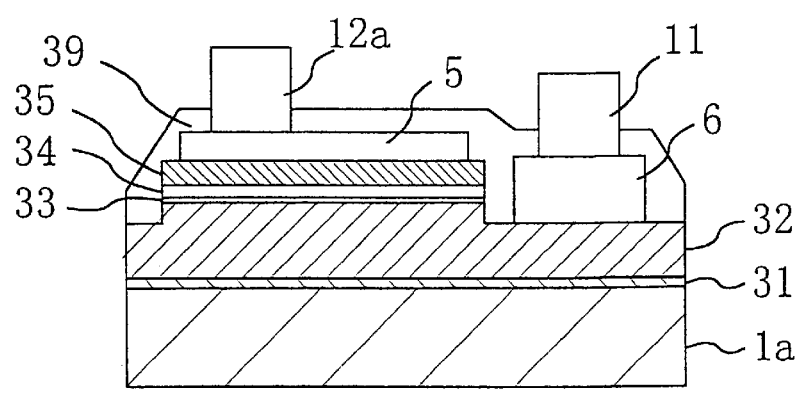

FIG. 32A is a plan view of the LED element 1 with the microbumps formed thereon by the plating method and FIG. 32B is a cross-sectional view thereof.

The structure of the LED element 1 shown in the drawings is essentially the same as the structure of the LED element 1 shown in FIGS. 31A and 31B, except that the microbumps are Au plated bumps, the protective film 39 is formed on the surface of the LED element, and the n-side electrode 6 occupies a smaller area.

Embodiment 18

In contrast to the fifteenth embodiment (FIG. 22) in which the microbumps are formed on the electrodes of the LED element by the stud bump method, the microbumps are formed on the electrodes of the LED element by the Au plating method in this embodiment. Since the present embodiment is the same as the fourteenth embodiment in the other respects, the detailed description thereof will be omitted.

Embodiment 19

Figure 25:
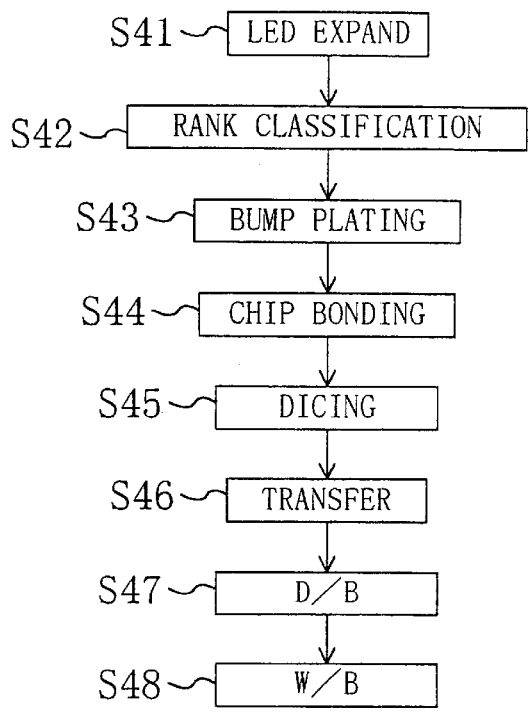
FIG. 25 is a flow chart illustrating a manufacturing method according to a nineteenth embodiment of the present invention.

FIG. 25 is a flow chart according to the present embodiment. The manufacturing method according to the present embodiment includes the step of forming the microbumps on the electrodes of the Si diode elements in the form of a wafer by the Au plating method. The present embodiment is the same as the fifteenth embodiment in the other respects. Accordingly, the LED expand process step, the rank classification process step, the plated bump formation process step, the chip bonding process step, the dicing process step, the transfer process step, the D/B process step, and the W/B process step will be performed sequentially in Steps S41, S42, S43, S44, S45, S46, S47, and S48, respectively.

Embodiment 20

Figure 26:
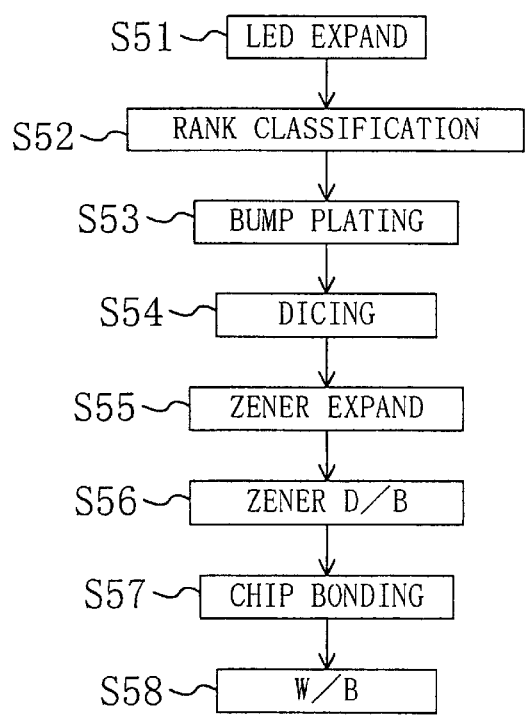
FIG. 26 is a flow chart illustrating a manufacturing method according to a twentieth embodiment of the present invention.

FIG. 26 is a flow chart according to the present embodiment. The manufacturing method according to the present embodiment includes the step of forming the microbumps on the electrodes of the Si diode elements in the form of a wafer by the Au plating method. The present embodiment is the same as the sixteenth embodiment in the other respects. Accordingly, the LED expand process step, the rank classification process step, the plated bump formation process step, the dicing process step, the Zener expand process step, the Zener D/B process step, the chip bonding process step, and the W/B process step will be performed sequentially in Steps S51, S52, S53, S54, S55, S56, S57, and S58, respectively.

In a flip-chip semiconductor light-emitting element as described above, the back face of the sapphire substrate serves as a main light-emitting face. If the semiconductor light-emitting element is formed in a wafer, therefore, the light-emitting face will be on the opposite side to the detector. Even when the light emitting face is on the opposite side to the detector, a certain amount of light leaks to reach the electrodes and can be detected by the detector. However, since the detected light is insufficient in total amount, the wavelength and brightness of the light cannot be measured with high accuracy.

As an exemplary approach to effectively increasing light supplied from the semiconductor light-emitting element formed on the wafer, it is imaginable to form an opening for supplying light to the surface, on which the electrodes are formed, which enables the measurement of the optical characteristics using the detector.

However, the formation of such an opening not only complicates the process step of forming the electrodes on the semiconductor light-emitting element but also may vary the accuracy of size of the opening in a photolithography process step or an etching process step, which affects the high-accuracy measurement of the optical characteristics.

Embodiment 21

Figure 34:
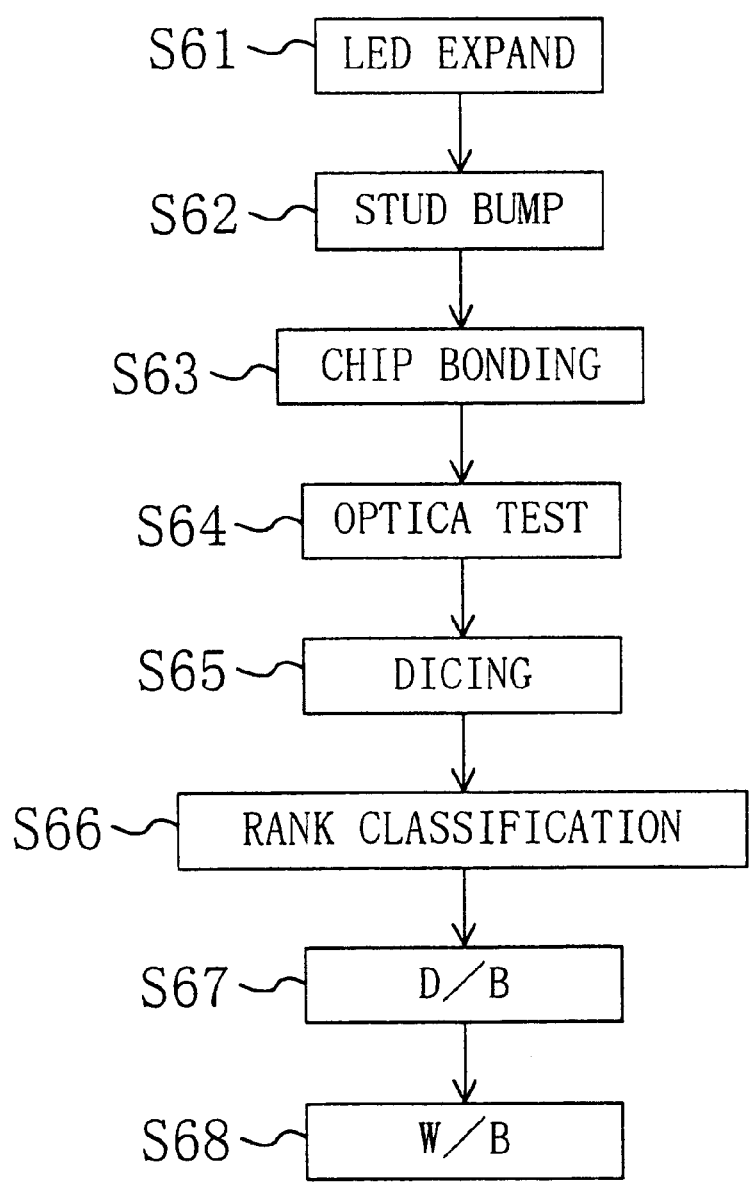
FIG. 34 is a flow chart illustrating a manufacturing method according to a twenty-first embodiment of the present invention.

Referring to FIG. 34, still another embodiment of the manufacturing method according to the present invention will be described.

In the present embodiment, the microbumps are formed as stud bumps on the electrodes of the Si diode elements in the form of a wafer, i.e., on the electrodes of the submount elements, the semiconductor light-emitting elements formed into individual chips are bonded to the submount elements, and then the optical characteristics are tested.

First, an LED expand process step is performed in Step S61. Then, the stud bumps 11 and 12 are formed on the p-side and n-side electrodes 7 and 8 of each of the Si diode elements 2 included in a wafer in a stud bump formation process step performed in Step S62.

Next, a chip bonding process step is performed in Step S63. Specifically, each of the LED elements 1 classified by rank is aligned with the corresponding Si diode element 2 in the wafer. More specifically, the LED element 1 with the surface thereof, on which the electrodes are formed, facing downward is brought closer to the wafer including the Si diode elements 2. Thereafter, the electrodes of the LED element 1 are aligned with the electrodes 7 and 8 of the Si diode element 2 and brought into contact with the microbumps 11 and 12, while heat, ultrasonic waves and load are applied to the microbumps. By thus welding the microbumps 11 and 12 to the electrodes, the LED element 1 is bonded onto the Si diode element 2 via the microbumps. By the bonding process step, the LED element 1 is electrically/physically secured to the Si diode element 2 via the microbumps (chip bonding process step).

At this stage, the flip-chip semiconductor light-emitting elements 1 with the sapphire substrates 1a facing upward are integrally chip-bonded to the submount elements 2 in the form of a wafer.

Figure 35:
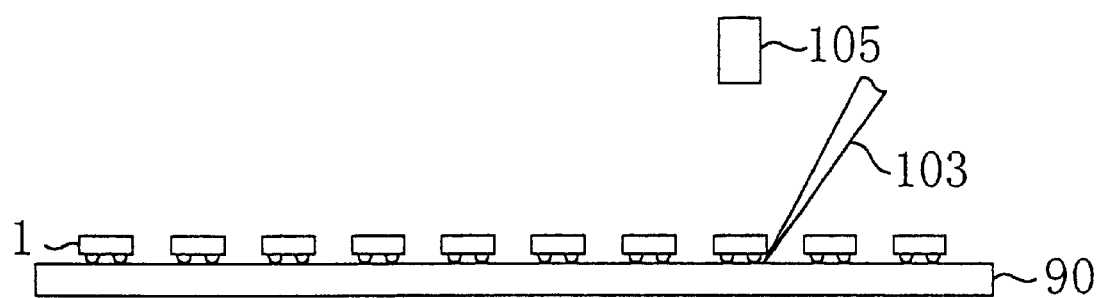
FIG. 35 is a cross-sectional view diagrammatically showing the relations among a wafer, a probe, and an photodetector in the process step of an optical characteristic test.

Next, in Step S64, the wafer is placed on the stage of a prober, a probe needle is brought into contact with the bonding pad portion 10 of each of the submount elements 2, and current is allowed to flow between the stage and the probe needle. FIG. 35 shows the relation among the wafer 90, the probe needle 103, and the photodetector 105 at this stage. When the semiconductor light-emitting element 1 emits light with the flowing current, the top face of the sapphire substrate 1 serves as the light-emitting face with maximum brightness. Consequently, a sufficient amount of light is supplied in the direction of the detector 105 positioned above the wafer so that the wavelength and brightness thereof are measured with high accuracy. Moreover, since the semiconductor light-emitting elements 1 are arranged integrally with given pitches in the wafer 90, measurement can be performed efficiently.

After the process step of testing the optical characteristics, the wafer is attached to a dicing sheet in Step S65 of FIG. 34 and divided into individual chips by dicing performed by a dicing device (see FIG. 28). In Step S66, rank classification by wavelength and brightness is performed and the integrated elements are transferred onto a tray.

Next, in Step S67, each of the integrated elements is secured onto the mount portion 15 of the leadframe 13a with the backside electrode 9 of the submount element 2 facing downward, while electrical connections are achieved via the conductive paste 14.

Next, in Step S68, the bonding pad portion 10 of each of the submount elements 2 is connected to the other leadframe 13b via the Au wire 17 (W/B). Finally, a molding process step is performed by using the mold resin 18 to provide a light-emitting device (FIG. 20) with the flip-chip semiconductor light-emitting element 1 mounted thereon.

Although the stud bumps are formed on the electrodes of the submount element 2 in accordance with the manufacturing method of the present embodiment, the optical characteristics can be tested in a similar manner even when the stud bumps are formed on the electrodes of the semiconductor light-emitting element 1.

In accordance with the manufacturing method of the present embodiment, the semiconductor light-emitting element 1 has the electrodes bonded onto the submount element 2 via the microbumps so that the sapphire substrate 1a faces upward. Consequently, the top face of the sapphire substrate 1a serves as a light-emitting face with maximum brightness in testing the optical characteristics by means of the prober. As a result, a sufficient amount of light is supplied in the direction of the detector D and the wavelength and brightness of light can be measured with high accuracy.

Hence, it becomes possible to test a structure in which the surface of the transparent substrate opposite to the face thereof opposed to the face, on which the p-side and n-side electrodes are formed, i.e., the light-emitting face with high brightness, faces upward as a result of bonding between the electrodes on the submount element via the microbumps. Since a sufficient amount of light is obtained from the light-emitting face in the process step of testing the optical characteristics by means of the detector, the wavelength and brightness of light can be tested with high accuracy, resulting in a high-quality light-emitting element.

Moreover, since the integrated light-emitting elements are formed with given pitches in the wafer with the light-emitting faces thereof facing upward, the wavelength and brightness of light can be measured with high efficiency and accuracy in the process step of testing the optical characteristics by means of the detector, resulting in improved production yield.

Thus, in the manufacturing method according to the present embodiment, the p-side and n-side electrodes of each of the light-emitting elements formed into individual chips are bonded to and integrated with the two dependent electrodes of the corresponding one of a plurality of submount elements arranged in rows and columns in the form of a wafer via the microbumps (chip bonding process step) while establishing electrical conduction therebetween and, after that, the optical-characteristic testing process step and the rank classification process step are performed. In accordance with the method, since the integrated light-emitting elements are formed with given pitches in the wafer with the light-emitting faces thereof facing upward, the optical characteristics such as wavelength and brightness of light can be measured with high efficiency and accuracy.

However, the submount elements need not necessarily be in the form of a wafer in the optical-characteristic testing process step but may be formed into individual chips. As long as the light-emitting element with the back face of the transparent substrate, i.e., the light-emitting face with high brightness thereof facing the photodetector is bonded onto the submount element via the microbumps, a sufficient amount of light can be obtained from the light-emitting face, which enables the measurement of the wavelength and brightness of light with high accuracy.

As described above, the present invention provides a miniaturized light-emitting element with improved brightness since the use of the microbumps eliminates the necessity for the bonding pad portions.

In addition, the present invention prevents various problems which may occur in the process steps of testing and assembling the light-emitting element with a flip-chip structure having microbumps, so that the testing and assembling process steps are performed without trouble.

The present invention also provides a highly reliable light-emitting device having a semiconductor light-emitting element provided on an insulating substrate, while incorporating the function of preventing a device destruction when a high voltage such as static electricity is applied thereto.

The method of manufacturing the semiconductor light-emitting device according to the present invention enables the implementation of a light-emitting element having p-type and n-type semiconductor regions formed on an insulating substrate, such as a GaN-based LED element, in which an electrostatic protection element, such as a diode element, is connected in parallel to allow current to flow by bypassing the p-type and n-type semiconductor regions when a high voltage is applied therebetween. Consequently, a highly reliable light-emitting device formed on the insulating substrate and yet having the function of preventing a device destruction due to static electricity or the like can be manufactured with excellent production yield. Improvement in the electrical connection between the light-emitting element and the electrostatic protection element and in means for condensing light from the light-emitting element further miniaturize the light-emitting device and increase the light-emitting efficiency.

If the method of manufacturing the light-emitting device according to the present invention includes the process step of bonding semiconductor light-emitting elements to submount elements in the form of a wafer, semiconductor elements such as silicon diodes can be used more easily as the submount elements. By using a silicon wafer, a plurality of semiconductor elements such as silicon diodes are fabricated simultaneously. The submount elements arranged regularly in rows and columns in the wafer facilitate the chip bonding process step.

In the case of forming stud bumps on the side of the semiconductor light-emitting element, the electrodes of the semiconductor light-emitting element are preferably made of Au or Al. The arrangement has the advantages of eliminating the necessity of adopting a special electrode structure and forming the microbumps only on excellent elements after the testing of the LED elements is completed. In the method of connecting the semiconductor light-emitting elements to the submount elements in the form of a wafer, however, the submount elements in the form of a wafer which have been integrated with the individual semiconductor light-emitting elements are divided, after bonding, into individual chips by dicing or a like method. If the alignment accuracy for bonding is low, therefore, a dicing blade may touch the semiconductor light-emitting element during dicing.

By contrast, an allowance for the alignment accuracy can be increased in the case of bonding the semiconductor light-emitting element to the independent submount element not in the form of a wafer via the microbumps.

In the case of forming the microbumps by plating, the chip size can be reduced at lower cost. Moreover, the alignment accuracy in the process step of microbump formation is higher than the alignment accuracy in the process step of stud bump formation.

In the method of forming the stud bumps on a wafer in which the submount elements are arranged, the formation of the stud bumps on the submount elements facilitates the handling of the semiconductor light-emitting elements.

INDUSTRIAL APPLICABILITY

The present invention enables the downsizing of a light-emitting element which emits light by using a semiconductor multilayer film formed on an insulating substrate and implements a compact package with a flip-chip structure by using a submount element capable of exerting the function of protecting the light-emitting element from an electrostatic destruction. Thus, the present invention provides a high-intensity light-emitting device excellent in mass productivity in the field of light-emitting devices such as an LED lamp.

What is claimed is:

1. A method of manufacturing a flip-chip semiconductor light-emitting device, the device comprising: a semiconductor light-emitting element having a semiconductor multilayer film formed on a transparent substrate and p-side and n-side electrodes formed on a surface of said semiconductor multilayer film; a submount element having at least two independent electrodes; and a base capable of supporting said submount element and supplying electric power to said submount element, said submount element being mounted on said base to be electrically conductive to said base, said semiconductor light-emitting element being mounted in a face-down configuration on a top face of said submount element, the method comprising:
a step of forming microbumps on the electrodes of either one of said semiconductor light-emitting element and said submount element; and
a chip bonding step of bonding the p-side and n-side electrodes of said semiconductor light-emitting element to said electrodes of said submount element via said microbumps.

2. The method of claim 1, wherein said chip bonding step includes the steps of:
bringing said semiconductor light-emitting element in the form of a chip closer to a wafer, in which a plurality of submount elements, including said submount element, are arranged in rows and columns; and
bonding said p-side and n-side electrodes of said semiconductor light-emitting element to said respective electrodes of said submount element formed in said wafer via said microbumps,
after said chip bonding step, the method further comprising the step of dividing said wafer into individual chips and forming, from said wafer, plural pairs of said semiconductor light-emitting elements and said submount elements integrated with each other.

3. The method of claims 1 or 2, wherein said chip bonding step includes the step of applying heat, ultrasonic waves and load to at least one of said semiconductor light-emitting element and said submount element, while bringing said electrodes opposed to each other into contact with each other via said microbumps, and thereby welding said microbumps to said electrodes.

4. The method of claim 2, wherein said microbump forming step includes the step of forming stud bumps onto the p-side and n-side electrodes of said semiconductor light-emitting element and said chip bonding step includes the steps of:
aligning the corresponding semiconductor light-emitting element with each of the submount elements in said wafer; and
welding said microbumps to said electrodes of each of the submount elements in said wafer to secure said semiconductor light-emitting element onto said submount element and provide mutual electric connections between the opposed electrodes via said microbumps,
said method further comprising the step of separating, from said wafer, said pairs of the semiconductor light-emitting elements and the submount elements integrated with each other, placing each of said pairs on a mount portion of said base, and fixing said submount element onto said base.

5. The method of claim 1, wherein said microbump forming step includes the step of forming stud bumps on the p-side and n-side electrodes of said semiconductor light-emitting element; and
said chip bonding step includes the step of disposing said submount element on a mount portion of said base, fixing said submount element onto said base, and welding said microbumps to said electrodes of said submount element to fix said semiconductor light-emitting element onto said submount element and provide mutual electric connections between the opposed electrodes via said microbumps.

6. The method of claims 4 or 5, wherein said microbumps are formed by a plating process step.

7. The method of claim 2, wherein said microbump forming step includes the step of forming stud bumps onto the electrodes of each of the submount elements formed in said wafer; and
said chip bonding step includes the step of aligning the corresponding semiconductor light-emitting element with each of the submount elements in said wafer and welding said microbumps to the electrodes of said semiconductor light-emitting element to fix said semiconductor light-emitting element onto said submount element and provide mutual electric connections between the opposed electrodes via said microbumps.

8. The method of claim 1, wherein said microbump forming step includes the step of forming stud bumps on the electrodes of said submount element; and
said chip bonding step includes disposing said submount element on a mount portion of said base, fixing said submount element onto said base, and welding said microbumps to the electrodes of said semiconductor light-emitting element to fix said semiconductor light emitting element onto said submount element and provide mutual electric connections between the opposed electrodes via said microbumps.

9. The method of claims 7 or 8, wherein said microbumps are formed by a plating process step.

10. The method of claim 1, further comprising, after said chip bonding step, an optical-characteristic testing step of bringing a probe needle into contact with said submount element and thereby testing light radiated from said semiconductor light-emitting element from above a top face of said transparent substrate by using a detector for an optical characteristic test positioned above said semiconductor light-emitting element.

11. The method of claim 2, wherein said chip bonding step includes the steps of:

bringing said semiconductor light-emitting element in the form of a chip closer to the wafer, in which the plurality of submount elements, including said submount element are arranged in rows and columns; and bonding the p-side and n-side electrodes of said semiconductor light-emitting element to said respective electrodes of said submount element formed in said wafer via said microbumps.

12. The method of claim 11 wherein said optical-characteristic testing step is performed with respect to each of the semiconductor light-emitting elements in said wafer after said chip bonding step.

* * * * *

UNITED STATES PATENT AND TRADEMARK OFFICE
CERTIFICATE OF CORRECTION

PATENT NO. : 6,642,072 B2 Page 1 of 1
DATED : November 4, 2003
INVENTOR(S) : Tomio Inoue et al.

It is certified that error appears in the above-identified patent and that said Letters Patent is hereby corrected as shown below:

<u>Title page,</u>
Item [75], Inventors, change "Kenichi Sanada, Hioki-gun (JP)" to -- Kenichi Sanada, Kagoshima (JP) --; change "Yasuhiko Fukuda, Hioki-gun (JP)" to
-- Yasuhiko Fukuda, Kagoshima (JP) --;
Item [56], References Cited, U.S. PATENT DOCUMENTS, change "5,658,434" to
-- 5,652,434 --;

Signed and Sealed this

Sixteenth Day of March, 2004

JON W. DUDAS
*Acting Director of the United States Patent and Trademark Office*